US006618300B2

United States Patent
Yamakoshi

(10) Patent No.: US 6,618,300 B2
(45) Date of Patent: Sep. 9, 2003

(54) SEMICONDUCTOR MEMORY DEVICE AND METHOD FOR REPLACING REDUNDANCY CIRCUIT

(75) Inventor: Hiroyuki Yamakoshi, Kanagawa (JP)

(73) Assignees: NEC Corporation (JP); NEC Electronics Corporation (JP)

( * ) Notice: Subject to any disclaimer, the term of this patent is extended or adjusted under 35 U.S.C. 154(b) by 0 days.

(21) Appl. No.: 09/965,199

(22) Filed: Sep. 27, 2001

(65) Prior Publication Data

US 2002/0057605 A1 May 16, 2002

(30) Foreign Application Priority Data

Sep. 27, 2000 (JP) ......................................... 2000-294521

(51) Int. Cl.$^7$ ................................................. G11C 7/00
(52) U.S. Cl. .................. 365/200; 365/201; 365/230.03; 365/230.06; 365/185.2
(58) Field of Search ................................ 365/200, 201, 365/230.03, 230.06, 185.2

(56) References Cited

U.S. PATENT DOCUMENTS

| | | | | | |
|---|---|---|---|---|---|
| 5,392,246 | A | * | 2/1995 | Akiyama et al. | 365/200 |
| 6,058,053 | A | * | 5/2000 | Tsuji et al. | 365/200 |
| 6,104,645 | A | * | 8/2000 | Ong et al. | 395/200 |
| 6,137,736 | A | * | 10/2000 | Kitayama | 365/200 |
| 6,154,399 | A | * | 11/2000 | Ogishima | 365/200 |
| 6,301,165 | B1 | * | 10/2001 | Kim | 365/200 |

* cited by examiner

*Primary Examiner*—David Nelms
*Assistant Examiner*—Connie C. Yoha
(74) *Attorney, Agent, or Firm*—Hayes Soloway P.C.

(57) ABSTRACT

In a semiconductor memory device, a plurality of banks is arranged on a semiconductor substrate. A plurality of memory array groups is arranged on the plates. Redundant memory cell array groups replace a memory cell array, including a defective memory cell, and are arranged at every plate. Subword selection circuits switch subword selection lines at every plate. Each of the subword selection circuits has a selection unit which selects a subword selection line on the plate belonging thereto and a redundant subword selection line of the redundant memory cell array arranged on the other adjacent plate.

15 Claims, 21 Drawing Sheets

SEMICONDUCTOR MEMORY DEVICE AND METHOD FOR REPLACING REDUNDANCY CIRCUIT

BACKGROUND OF THE INVENTION

This invention broadly relates to a semiconductor memory device, and a method for replacing a redundant circuit. More specifically, this invention is directed to a semiconductor memory device which has an improved redundant subword selection circuit in a subword system.

With recent reduction of a semiconductor device in size, an LSI (Large scale integrated circuit) having the semiconductor device has become popular.

For example, a dynamic type random access memory (DRAM) or a synchronous random access memory (SDRAM) has been used as a semiconductor memory device having capacity of 256 Mbit for one chip.

In such a semiconductor memory device, a memory cell array is divided into a plurality of banks. With this structure, a redundant memory cell array, namely, a redundant memory region is provided outside a main memory in each bank.

Herein, a normal memory cell array is arranged in the main memory while a spare memory cell array is placed in the redundant memory cell array.

Meanwhile, suggestions have been made in the art about a word shunt system with respect to word line selection for selecting a predetermined memory cell.

In such a word shunt system, a gate wiring pattern (wiring line) and a metal pattern (metal line) having low resistance are alternately wired in parallel as a wiring method for improving writing/reading speed.

However, it is becoming difficult to form a metal wiring layer for the word shunt in accordance with the pitch of the memory cell with large capacity memory.

To solve this problem, use generally has been made of a subword system in which a subword driver is arranged in the memory cell array so as to designate via the subword driver.

In the above-discussed semiconductor memory device of the sub-word system, application has been made about a defect relieving technique in which a spare redundant memory cell array is used instead of the defective memory when a defect is detected in a part of the main memory.

In other words, even when a small number of defects occur in the main memory region in a production process, the total function of the semiconductor memory device will not be damaged.

In such a semiconductor memory device having a redundant circuit, an electrical characteristic test is carried out in a wafer-selecting step during the production process.

As the result of the test, when the defect exists in the memory cell array, the address of the memory cell array having the defect is programmed with a fuse arranged inside the redundant circuit.

Thereby, the writing/reading operation is halted for a defective memory cell in the main memory region, and the writing/reading operation is performed by the redundant memory cell in the redundant memory region.

In this event, the switching to the redundant memory cell is carried out at every word line and every bit line. Under this circumstance, address information of the defective portion is necessary in the switching for each word line while bit position information of the defective portion is required for each bit line.

Namely, when the defective memory cell is detected, the position of the fuse to be cut is determined on the basis of the address information of the defective portion, and the fuse is, for example, fused by irradiating it with a laser beam. With this fusing, the position of the defective memory cell is written to a ROM fuse.

As described above, the position of the defective memory cell is written to the fused ROM. Consequently, when the memory corresponding to the cut fuse is selected, the switching is carried out such that the redundant memory region is selected in lieu of the main memory.

More specifically, the address of the memory cell in the selected main memory region is compared with the address of the defective memory cell in the redundant memory region. In the comparison result, if the defective memory cell is selected, the redundant memory cell in the redundant memory region will be accessed.

As discussed before, the number of necessary redundant memory cells is also increased with the increase of the memory capacity of the semiconductor memory device.

Accordingly, it is important to reduce the number of component elements of the semiconductor memory device as small as possible in order to efficiently arrange the increased number of redundant memory cells.

Referring to FIG. 1, a related memory cell array will now be described.

Such a memory cell array is divided into two banks, an A bank and a B bank in an X-direction (a lateral direction), and is divided into two banks in a Y-direction (a vertical direction). Thereby, the memory cell array is divided into four areas consisting of an upper bank A, a lower bank A, an upper bank B, and a lower bank B.

With such a structure, one bank, for example, the A bank, has a memory capacity of 32 M bits, and is further divided into 16 plates of A0P~A15P. Each of the plates A0P and A1P is composed of one plate. The one plate (a portion indicated by oblique lines in the figure) has 2M bits, and 512 word lines×4K bit lines. In the 512 word lines, the address is composed of 9 bits of X0~X8.

A word driver block 11 is arranged in the X-direction, and a driving word line is lined up although not shown. Further, a bit line is arranged so as to cross with a main word line extended in the Y-direction from the word driver block, although also not shown.

The selection of the memory cell is carried out by selecting the word line arranged in the X-direction by the use of the X-address and by selecting the bit line arranged in the Y direction by the use of the Y address.

Under this circumstance, a data signal is written/read for the selected memory cell by selecting the memory cell positioned at the portion where the word line and the bit line are crossing.

In the above-mentioned semiconductor memory device, the word driver for driving the word line of the memory cell array is connected to a backed metal wiring pattern (line) such as an aluminum pattern in the output thereof, and is constituted with the same pitch as the polysilicon wiring pattern and the aluminum wiring pattern.

However, the reduction in size has advanced with the large capacity of the LSI, as described above. In consequence, it is becoming difficult to pattern the aluminum line with the pitch of the polysilicon wiring line connected to the gate of the memory cell.

Further, the height of the formation layer in a memory cell portion on a semiconductor substrate becomes higher. Under this circumstance, it is difficult to pattern the aluminum line because of projections or protrusions occurred in a boundary thereof.

To solve such a problem, a division word driver system, which can readily avoid passing through the aluminum line in the memory cell portion, has been adopted recently.

In this system, a word driver is divided into a main word driver and a subword driver. With such a structure, the subword driver is selected by the main word line for driving with main word driver, and the selected subword driver drives the word line (subword line) for selecting the memory cell.

Referring now to FIG. 2, for example, when one main word line MWE is selected, subword drivers SWD21a, 21b, and 21c, which are connected to the main word line MWE, are selected and activated.

The sub-word drivers SWD 21a, 21b and 21c are arranged at both sides of a memory cell line in parallel with a bit line pair. Herein, subword lines SW00~SW13, which are produced from the subword lines at the both sides, are arranged so as to form a comb structure with each other by sandwiching the memory cell.

For example, the subword driver SWD 21b is connected to subword lines SW11 and SW13 at right and left sides thereof. Herein, the subword lines SW11 and SW13 designate the memory cell at even number lines of memory cell lines arranged at right and left sides.

The subword driver SWD21a is connected to subword lines SW00 and SW02, which designates the memory cell corresponding to a normal rotation bit line T among bit line pairs at right and left sides.

The subword driver 21c is connected to the subword lines SSW20 and SW22, which designate the memory cell corresponding to the normal rotation bit line T at right and left sides.

With this structure, one subword line is selected and driven by the use of subword selection signals SWE0~SWE3 given to the subword driver, so that the cell 11 is selected.

For example, when the subword selection signals SWE0~SWE3 are equal to "H", "L", "L", "L", respectively, the subword lines SW00 and SW20 are driven, and thereby, the cell 11 connected to the subword lines SW00 and SW20 is selected. For example, when SW0 is selected, the subword lines SW00 and SW20 are selected.

Further, the X-redundant circuit for replacing the word line and the Y-redundant circuit for replacing the bit line have been arranged such that optimum arrangement can be carried out in the related semiconductor memory device.

However, a buffer is arranged in a read/write bus portion, and a data signal is transferred between the memory cell and the buffer at high speed.

A virtual channel SDRAM of 64M/128M having such specification has been put into use. It is predicted that such product will have a large commercial appeal. In this specification, the Y-redundant circuit cannot be sufficiently provided because priority is given to the speed so as to decrease the chip area.

To this end, the main word replacing method is supplanted by the subword replacing method for replacing with a subword unit, and the replacing unit is subdivided so as to improve replacing efficiency. Thereby, the lack of the Y-redundant circuit can be compensated for.

Herein, the unit of the subword drivers selected by the main word line is collectively replaced in the main word replacing method.

Referring to FIG. 3, the related block layout comprises a one plate memory array 11, a redundant circuit 21, a sense amplifier (hereinafter, may be referred to as S.A in the figure) 31, a main word driver 51, and a redundant main word driver 81.

A subword selection circuit 1110 and a redundant subword selection circuit 1120 are adjacently arranged in the Y-direction of the memory array 11.

The subword line is selected with the address by the subword driver (not shown) which is positioned in the region where the main word line 61 of the selected memory cell array 11 and the subword selection signal 41 are crossing. Thereby, the memory cell is selected.

In the reading operation, the data signal read out from the memory cell is transferred to the bit line 102, and is amplified in the sense amplifier 31 for the data line 110.

The subword selection signal 41 is commonly wired on the plate n and the plate n+1. The redundant subword selection signal 91 is commonly wired to the redundant circuits of the plate n and the plate n+1.

Referring to FIG. 4, the arrangement of the buffer 1140 and the data transfer line 113 are different from FIG. 3.

Further, the subword selection circuits 1110 of the plate n and n+1 are arranged adjacent to the main word driver under the plate. The redundant subword selection circuit 1120 is also arranged adjacent to the main word driver under the redundant circuit. Moreover, the redundant subword selection signal 91 and the subword selection signal 41 are wired in the perpendicular direction.

Typically, the number of buffers 1140 and the data transferring lines 113 is higher to enhance transfer efficiency. For example, the number of the data transfer lines is equal to 1 k for 4 k of bit lines. In this condition, the data signals of 1 k bit are collectively transferred from the memory cell of 4 K bit to the buffer.

To this end, considering the layout efficiency, the buffer 1140 is adjacently arranged in the Y-direction of the plate n+1. The subword selection circuit 1110 and the redundant subword selection circuit 1120 are placed adjacent to the main word driver.

In this event, the layout is carried out by corresponding to the X direction width of the redundant circuit 21 with the width of the redundant subword selection circuit 1120. Consequently, the layout inevitably becomes complex.

Referring to FIG. 5, a plate n–100 includes a subword selection circuit block 124, subword selection signal lines (four line bundle) 114~117, subword drivers 121a~121e, a memory cell array, a redundant subword selection block 127, redundant subword drivers 122a~122e, redundant subword selection signals 121~134, and a redundant memory cell array.

Similarly, a plate n+1–200 includes a subword selection circuit block 224, subword selection signal lines (bundle of four lines) 214~217, subword drivers 221a~221e, a memory cell array, a redundant subword selection block 227, redundant subword drivers 222a~222e, redundant subword selection signals 231~234, and a redundant memory cell array.

With such a structure, the main memory is selected by the use of the subword selection circuit blocks 124 and 224 while the memory of the redundant circuit is selected by the use of the redundant selection circuit blocks 127 and 227.

Referring to FIG. 6, the subword selection circuit block 124 comprises a block of subword selection circuits 301 to 304 which produces subword selection signals SWE00~SWE03 (line bundle 114), a block of subword selection circuits 311 to 314 which produces subword selection signals SWE10~SWE13 (bundle 115 of lines), a block of subword selection circuits 321 to 324 which produces subword selection signals SWE20~SWE23 (line bundle 116), and a block of subword selection circuits 331 to 334 which produces subword selection signals SWE30~SWE33 (line bundle 116).

The subword selection circuit illustrated in FIG. 7 contains a first CMOS inverter which is given a subword decode signal X0, a first N channel MOS transistor N2 which is given a first plate selection signal PSn between a source of an N-channel MOS transistor N1 of the inverter and a ground potential, a second N-channel MOS transistor N3 which is given a redundant non-selection signal REB, and a third N-channel MOS transistor N4 which is given a subword decode signal X1X2, and all these elements are connected in series.

With this structure, an output of the first MOS inverter is pull-up to a power supply potential VBOOT via a first P-channel MOS transistor P2, and a second MOS inverter receives the output of the P-channel MOS transistor to produce the output as a first subword line selection signal SWEn. The output of the second MOS inverter is also provided to the gate of the P channel transistor P2.

In the subword selection circuit, a redundant non-selection signal REB is put into an "L" level when replacing, and is inactivated. When the redundant non-selection signal REB is put into an "H" level when not replacing, a plate selection signal Ps is put into an "H" level, the subword decode signal X0 is put into an "H" level in a lower address signal, and a lower address signal X1X2 is put into an "H" level. Consequently, the selected subword selection signal SWE is put into an "H" level. When replacing, the redundant non-selection signal REB is put into an "L" level, resulting in inactivation.

Referring to FIG. 8, the redundant subword selection circuit block includes a block of redundant subword selection circuits 361 to 364 which produces redundant subword selection signals RSWE00~RSWE03 (bundle 131 of lines), a block of redundant subword selection circuits 371 to 374 which produces redundant subword selection signals RSWE20~RSWE23 (bundle 133 of lines), a block of redundant subword selection circuits 381 to 384 which produces redundant subword selection signals RSWE20~RSWE23 (bundle 116 of lines), and a block of redundant subword selection circuits 391 to 394 which produces redundant subword selection signals RSWE30~RSWE33 (bundle 134 of lines).

The redundant subword selection circuit illustrated in FIG. 9 is different from the above-mentioned subword selection circuit in that an inverter IV is connected to the gate of the N-channel MOS transistor N3 which is provided with a redundant non-selection signal REB.

Specifically, the subword selection circuit and the redundant subword selection circuit have a complementary relationship for the redundant non-selection signal REB.

For example, when replacing, the redundant non-selection signal REB is put into an "L" level; the plate selection signal PSn is put into an "H" level, the subword decode signal X0 is put into an "H" level; and the redundant selection signal RS is put into an "H" level. Thereby, an "H" level appears for the selected redundant subword selection signal RSWEn.

In the meantime, when not replacing, the redundant non-selection signal REB becomes an "H" level, resulting in inactivation.

Namely, when the redundant non-selection signal REB is equal to an "H" level, the replacement is not carried out. Consequently, the memory cell array of the main memory is selected, and the redundant memory region is not selected.

Conversely, when the redundant non-selection signal REB is equal to an "L" level, the memory cell array of the main memory region is not selected, and the redundant memory region is selected.

The main word driver circuit illustrated in FIG. 10 and the redundant main word driver circuit illustrated in FIG. 11 are similar to the above-mentioned subword selection circuit in the basis structure.

Specifically, VBOOT is supplied to the power supply potential in the main word driver circuit. Further, decode signals of addresses X3 to X5 are given as input signals. A plate selection signal PSn and decode signals of addresses X6 to X8 are given as the other condition input signals. Further, MWEnm is produced as the main word selection signal.

The redundant main word driver circuit inputs only the plate selection signal PSn as the input condition signal, and does not input the decode signals of the addresses X6 to X8 to produce the redundant main word line RWE different from the main word driver circuit.

Referring to FIG. 12, a subword driver circuit includes transistors N13, N15, N17, and N19 which are commonly given with VBOOT and are commonly connected to the main word line via the drain thereof, and transistors N14, N16, N18, and N20 which are connected to the corresponding gate via the sources of the transistors N13~N19, and are connected to output lines corresponding to the respective subword selection circuits via the drains.

With such a structure, the sources of the transistors N14, N16, N18, and N20 are connected to subword selection signal lines SWnm, SWnm+2, SWnm+4, and SWnm+6, respectively, and are branched so as to be connected to the memory cell array arranged in the upward and downward directions of the Y-direction.

As discussed above, the subword selection signal lines are arranged in a comb form. In consequence, the sources of the subword driver transistors N14, N16, N18, and N20, which are arranged at the opposite side via the memory cell array, are connected to the subword selection signal lines SWnm+1, SWnm+3, SWnm+5, and SWnm+7, respectively.

For example, in the memory cell sandwiched between the subword drivers 122b and 122c, the word line corresponding to the normal rotation bit line T among the bit line pairs representing by SW00, SW02, SW04, and SW06 is activated by the use of the subword driver 122b while the word line corresponding to the normal rotation bit line B among the bit line pairs representing by SW01, SW03, SW05, and SW07 is activated by the use of the subword driver 122c.

In a subword decoder block 403 illustrated in FIG. 13A, an address X0 becomes an inversion signal XON by an inverter IV1, and becomes a normal rotation signal X0T by inverters IV2, IV3.

Namely, when the address X0 is equal to an "L" level, the inversion signal XON becomes an "H" level, and the normal rotation signal X0T becomes an "L" level.

In the meantime, when the address X0 is equal to an "H" level, the inversion signal XON becomes an "L" level, and the normal rotation signal X0T becomes an "H" level.

Referring to FIG. 13B, X1N2N="L", "L"=0, X1T2N="H", "L"=2, X1N2T="L", "H"=1, X1T2T="H", and "H"=3 are produced as the X12 decode signal, depending upon the state of the addresses X1 and X2.

Subsequently, description will be made about an operation on the basis of the above-mentioned structure with reference to FIG 14.

At time prior to time t1, a pre-charge state is kept, and all of the subword decode signals are put into "L" levels. In this case, the address is set so as to select the plate n.

At time t1, a command and an address are synchronized with rising of a clock. Herein, a command referred to as "active" serves to select a word.

At time t2, the selection signal PSn of the plate n becomes an "H" level while decode signals X345 and X678 of addresses X3, X4, X5 and X6, X7, X8 become "H" levels. Further, X0 and X1X2 serving as the subword decode signals also become "H" levels.

When a redundant main word active signal PXR becomes an "H" level, a precharge signal PRC also becomes an "H" level, a redundant address is detected and replaced, at time T3, a redundant selection signal RSpq is put into an "H" level, and a redundant non-selection signal REBp is put into an "L" level.

At time t4, the selected main word signal MWEnm becomes an "H" level and a redundant main word signal RWEn becomes an "H" level by decode signals X345 and X678 of X3, X4, X5 and X6, X7, X8.

At time t5, the redundant subword selection signal RSWEn of the plate n is generated. At time t6, the redundant subword signal RSWn of the plate n is selected.

When not replacing, in the timing chart illustrated in FIG. 14, at time t3, a redundant selection signal RSpq becomes an "L" level, and a redundant non-selection signal REBp becomes an "H" level.

At time t4, the main word line MWEnm selected by decode signals X345 and X678 of X3, X4, X5 and X6, X7, X8 is put into an "H" level, and the redundant main word line RWE is put into an "L" level.

At time t5, the subword selection signal SWEn of the plate n is generated. At time t6, the subword line SWn is selected.

In the above-mentioned related semiconductor memory device using the subword system, the subword selection circuit and the redundant subword selection circuit are provided at every plate. Consequently, the layout area of these circuits occupied on the chip inevitably becomes large.

In the related technique, the subword selection circuit is arranged on an extending line in Y-direction of the memory cell array. The subword selection signal line as the output thereof is extended and arranged in the Y-direction in the memory cell region.

In this condition, a predetermined number of subword lines are branched and arranged so as to extend from the subword selection line serving as a main line in the Y-direction parallel to the X axis. Thereby, a layout is formed so as to cross with the main word selection line in the Y-direction so as to reduce the affect of the layout.

However, in the case where the buffer is arranged in parallel adjacent to the Y-direction of the memory array, the subword selection circuit is arranged adjacent to the main word driver. As a consequence, the wiring structure becomes complex.

In addition, in the case of the subword replacing method, the redundant subword selection circuit has a substantially equivalent scale with the subword selection circuit.

However, the redundant subword selection circuit is arranged so as to match with the width of the redundant circuit. Consequently, the layout further becomes complex, so that the layout area becomes large.

SUMMARY OF THE INVENTION

It is therefore an object of this invention to provide an improved subword selection circuit in a subword system.

It is another object of this invention to provide a semiconductor memory device and a redundant circuit replacing method in which the redundant subword selection circuit is eliminated at every plate.

In a semiconductor memory device according to one aspect of this invention, a plurality of banks are arranged on a semiconductor substrate. A plurality of plates are also arranged, and a plurality of memory array groups are arranged on the plates.

Redundant memory cell array groups replace a memory cell array including a defective memory cell and are arranged at every plate. Subword selection circuits switch subword selection lines at every plate.

With such a structure, each of the subword selection circuits has a selection unit which selects a subword selection line on the plate belonging thereto and a redundant subword selection line of the redundant memory cell array arranged on the other adjacent plate.

The subword selection line is selected by the use of a subword driver, and predetermined redundant subword lines of the memory cell array and the redundant memory cell array are selected after an arbitrary main word line is selected by a row decoder during selecting a word line.

In a semiconductor memory device according to another aspect of this invention, a plurality of plates are arranged on a semiconductor substrate at every bank.

Each of the plates includes memory cell array groups, subword driver groups which select word lines of the memory cell array groups, subword driver selection units which select one among the subword driver groups, redundant memory cell array groups which replace a memory cell array group including a defective memory cell, redundant subword driver groups which select word lines of the redundant memory cell array groups, and a redundant subword selection unit which selects one among the redundant subword driver groups.

With this structure, the redundant subword selection unit commonly uses the subword selection units between the adjacent plates, and is given a subword selection signal generated by the subword selection unit of one plate as a redundant subword selection signal of the other plate in order to control selection of the word lines.

In a semiconductor memory device according to still another aspect of this invention, first and second plates are arranged on a semiconductor substrate at every bank.

Each of the plates includes memory cell array groups, subword driver groups which select word lines of the memory cell array groups, subword driver selection units which select one among the subword driver groups, redundant memory cell array groups which replace a memory cell array group including a defective memory cell, redundant subword driver groups which select word lines of the redundant memory cell array groups, and a redundant subword selection unit which selects one among the redundant subword driver groups.

With such a structure, both the subword selection unit and the redundant subword selection unit are commonly used by only the subword selection unit. The subword selection unit commonly used between the plates is commonly used between the first and second plates. The common use between the first and second plates is carried out by the subword selection unit which commonly uses the redundant subword selection lines of the first and second plates in the other plate to each other.

As described above, the semiconductor memory device has the subword selection circuits for switching the selection of the subword selection lines at every plate.

With this structure, each of the subword selection circuits has the selection unit for selecting the subword selection lines on the plate belonging thereto and the redundant subword selection lines of the redundant memory cell array arranged on the other adjacent plate.

Thereby, the subword selection circuit of the adjacent plate n, n+1 can be commonly used between these plates.

Consequently, 16 of the redundant subword selection signals specific to the conventional redundant wired inside the memory cell array for one plate, and 16 of the redundant subword selection circuits specific to the conventional subword selection circuit can be eliminated entirely according to this invention.

Further, the chip size can be reduced as the secondary effect. In consequence, both the package size and the mounting size can be reduced, and the consumption current can be lowered also.

DESCRIPTION OF PREFERRED EMBODIMENT

Figure 15:
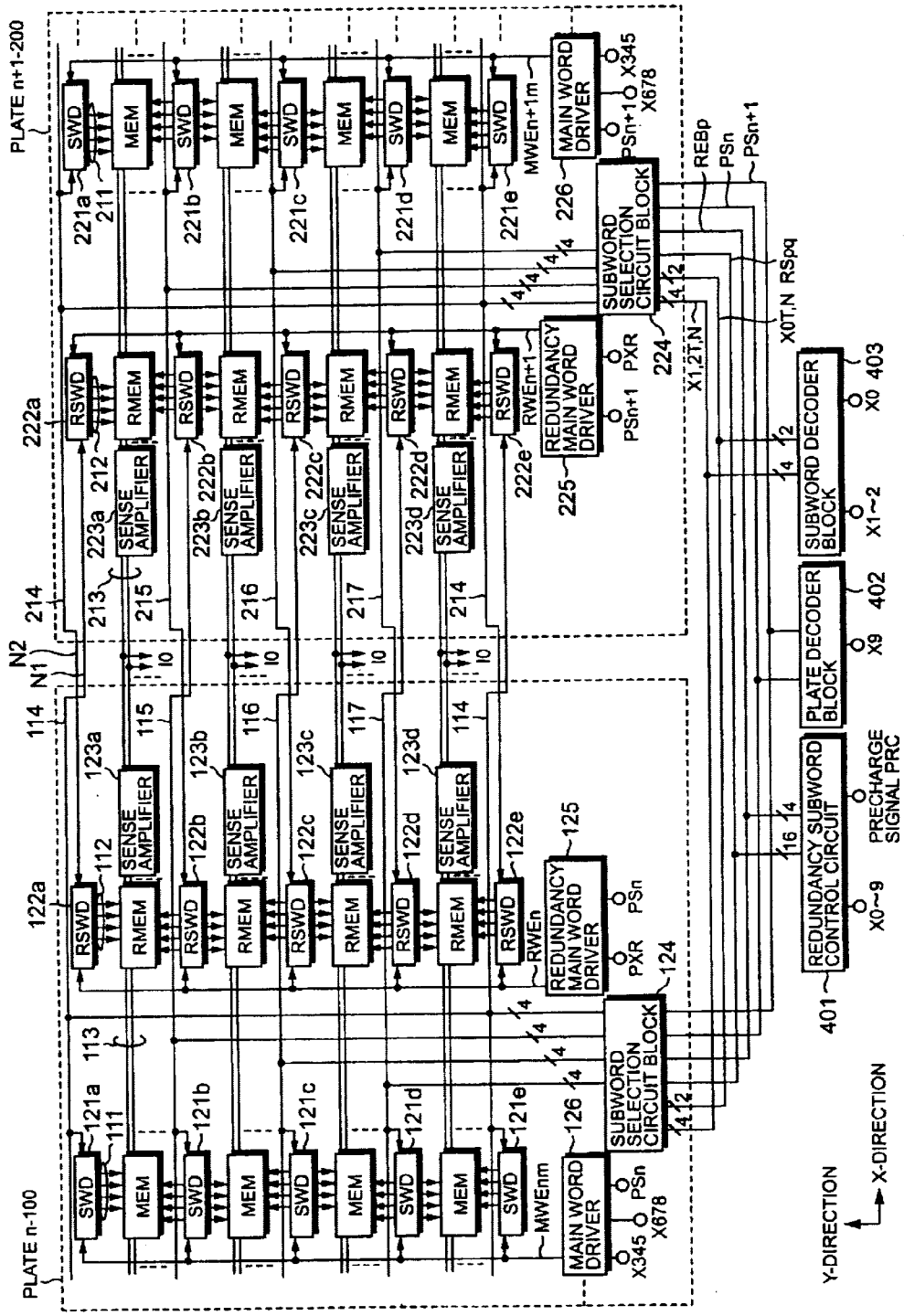
FIG. 15 a block diagram showing a subword selection circuit of a semiconductor memory device according to a first embodiment of this invention.

Referring to FIG. 15, a subword selection circuit of a semiconductor memory device according to a first embodiment of this invention will now be described.

A semiconductor memory device 1 includes a plate n–100, a plate n–200, a redundant subword control circuit 401, a plate decoder block 402, and a subword decoder block 403.

The plate n–100 comprises a subword drivers 121a~121e, redundant subword drivers 122a~122e, sense amplifiers 123a~123d, a subword selection circuit block 124, a redundant main word driver 125, a main word driver 126, a memory cell array, and a redundant memory cell array.

Similarly, the plate n+1–200 includes subword drivers 221a~221e, redundant subword drivers 222a~222e, sense amplifiers 223a~223d, a subword selection circuit block 224, a redundant main word driver 225, a main word driver 226, a memory cell array, and a redundant memory cell array.

The semiconductor memory device according to this invention is different from the above-discussed related semiconductor memory device in that the selection of the main memory and the memory selection of the redundant circuit is carried out by the use of the subword selection blocks 124, 224, and the redundant subword selection circuit blocks 127, 227 specific to the memory selection of the related redundant circuit are eliminated or omitted according to this invention.

With such a structure, the redundant subword control circuit 401 is provided with addresses X0~X9 and a precharge signal PRC, and produces a redundant selection signal RSpq and a redundant non-selection signal RSBp to produce for the subword selection circuits 124 and 224.

In this example, the redundant selection signal RSpq is provided to 16 of the signal lines in accordance with the subword and redundant subword selection lines.

That is, the number of the redundant selection signals RSpq is 16 in order to switch the redundant subword selection signals line (bundle of 4 lines) 114~117, as illustrated in FIG. 15.

The redundant non-selection signal RSBpq is given to 4 of the signal lines in accordance with the subword selection signals (SWE0n~SWE3n) lines 114~117 and the redundant subword selection signal lines 214~217 in this example.

Figure 1:
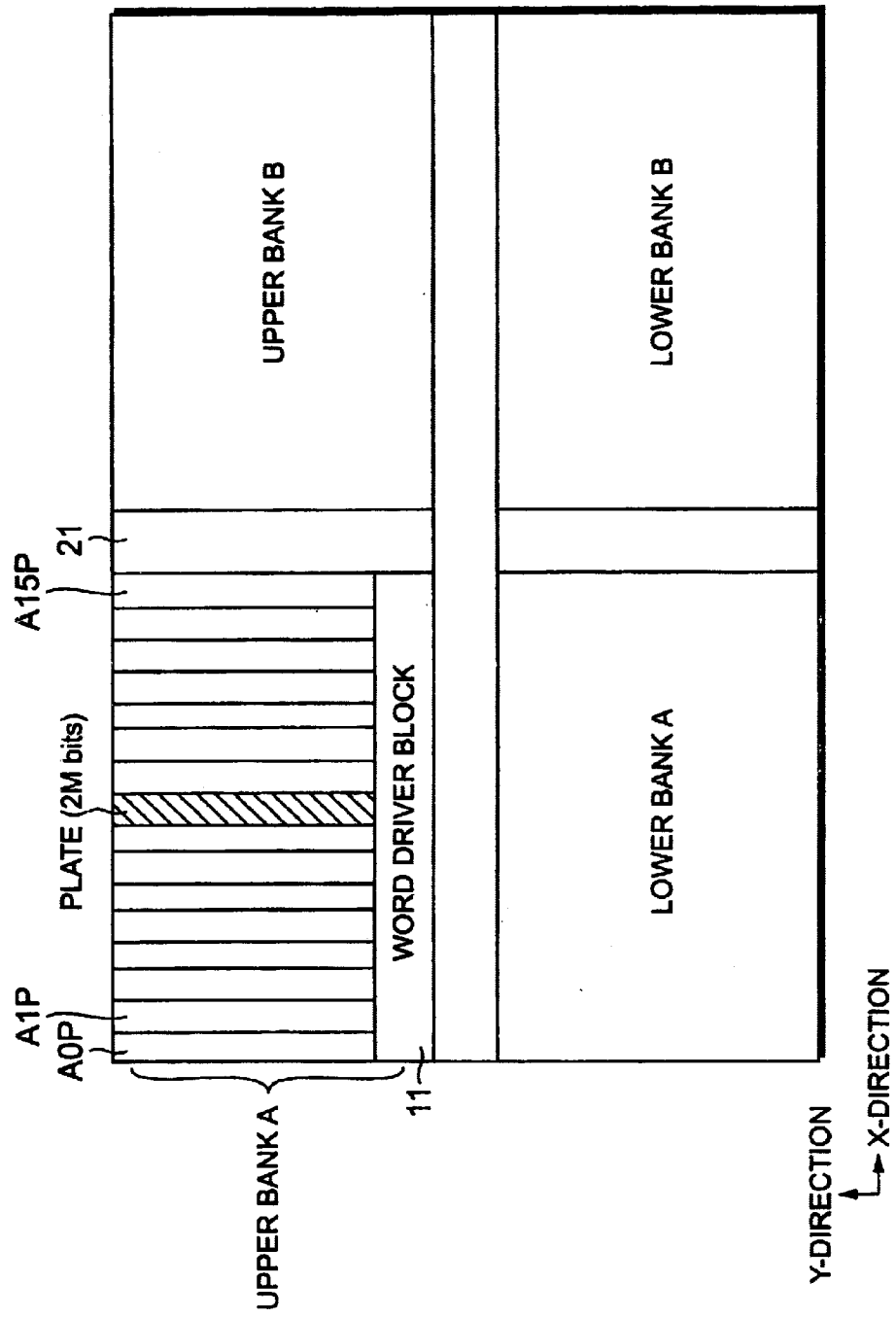
FIG. 1 is a diagram showing a related memory cell array.
Figure 2:
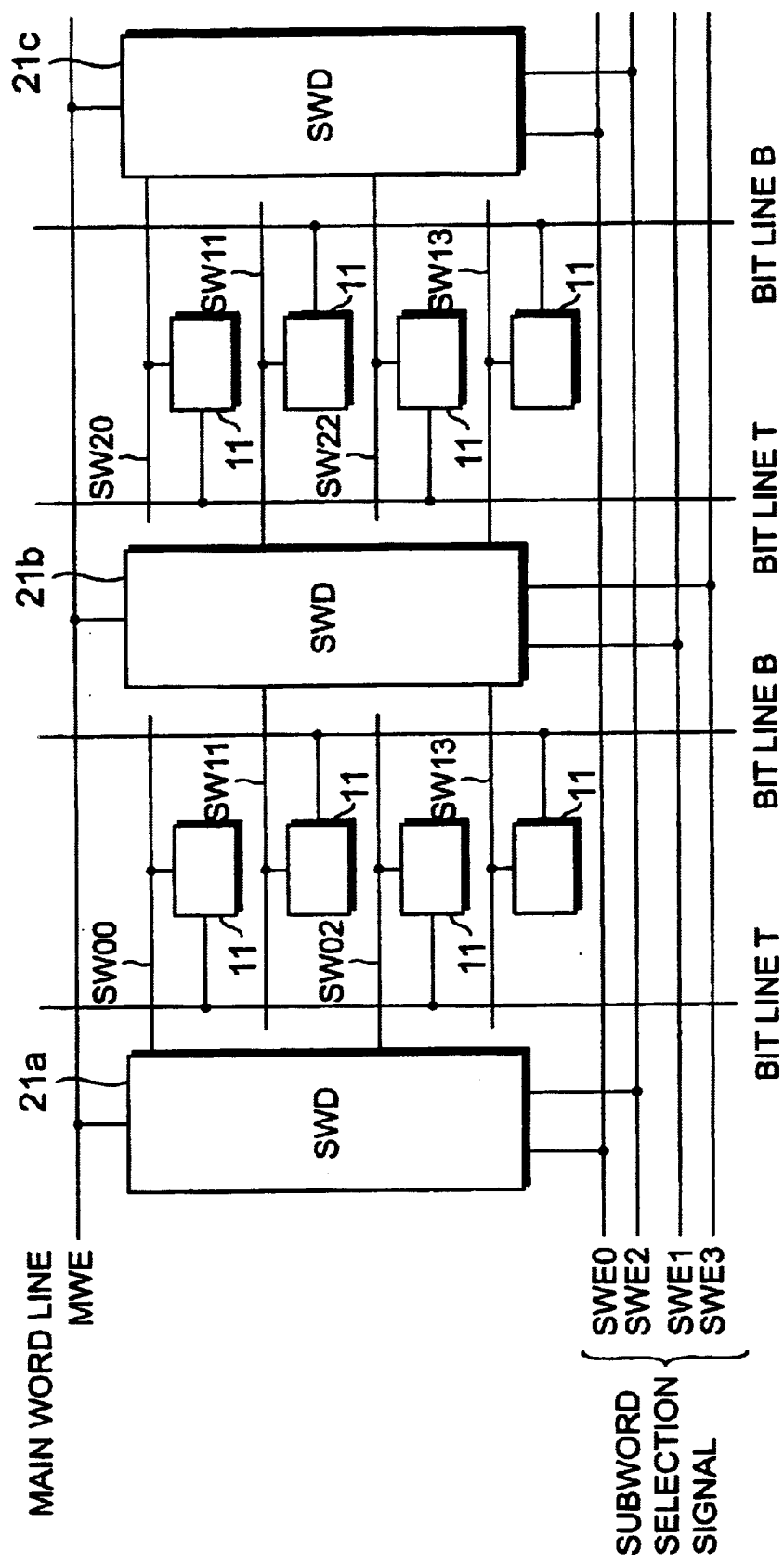
FIG. 2 is a block diagram of a division word driver system.
Figure 3:
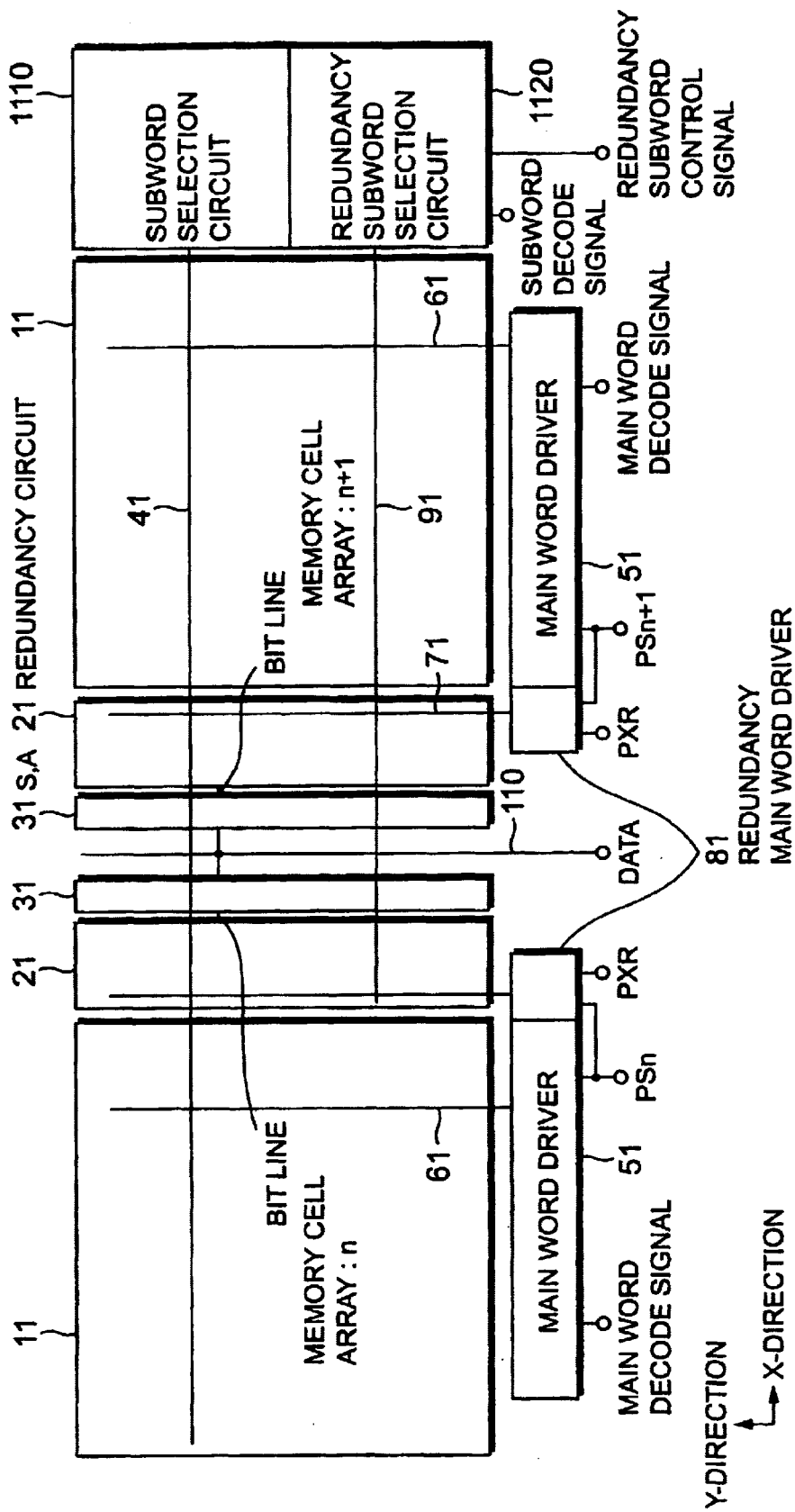
FIG. 3 is a diagram showing a related block layout.
Figure 4:
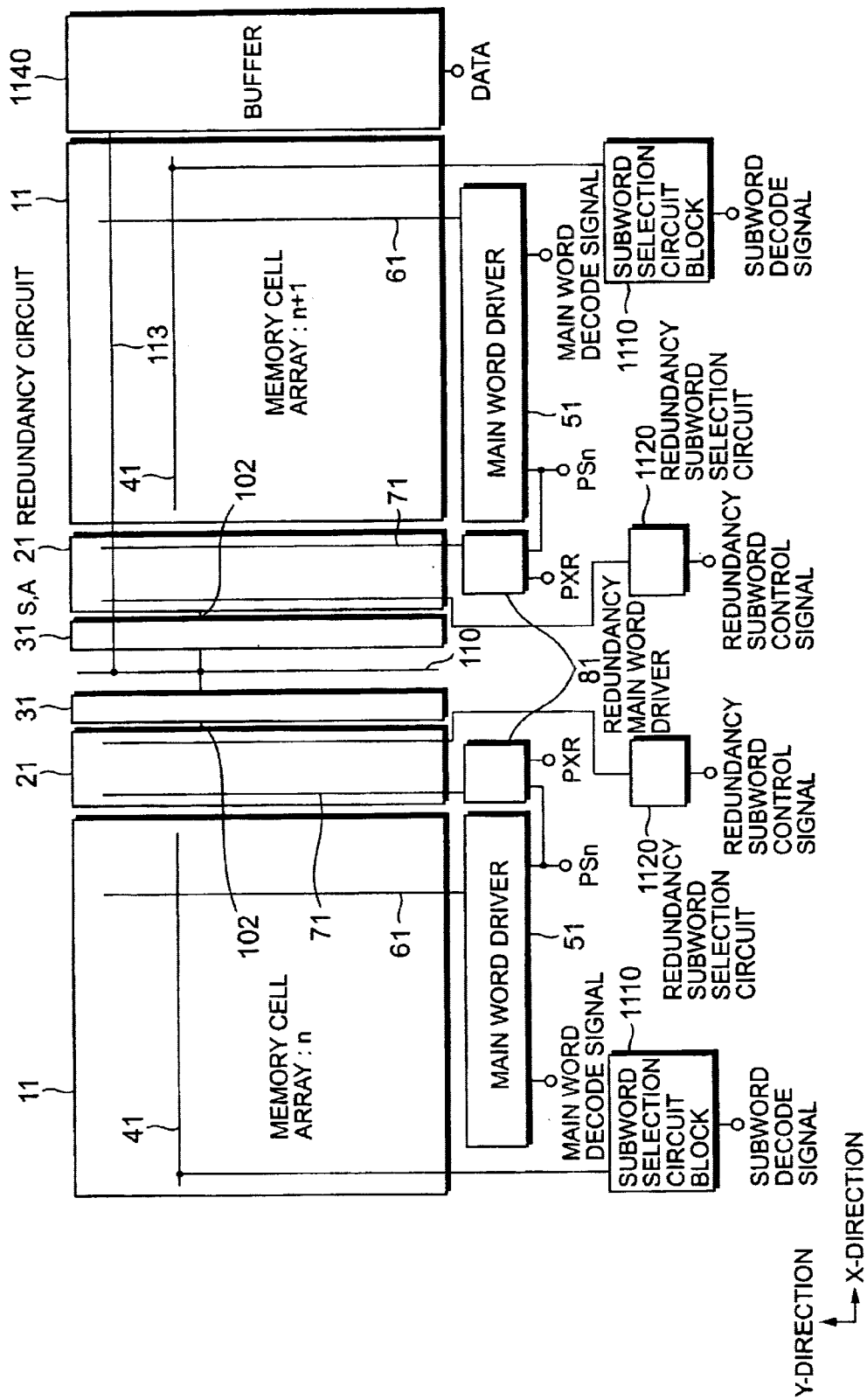
FIG. 4 is a diagram showing another related block layout.
Figure 5:
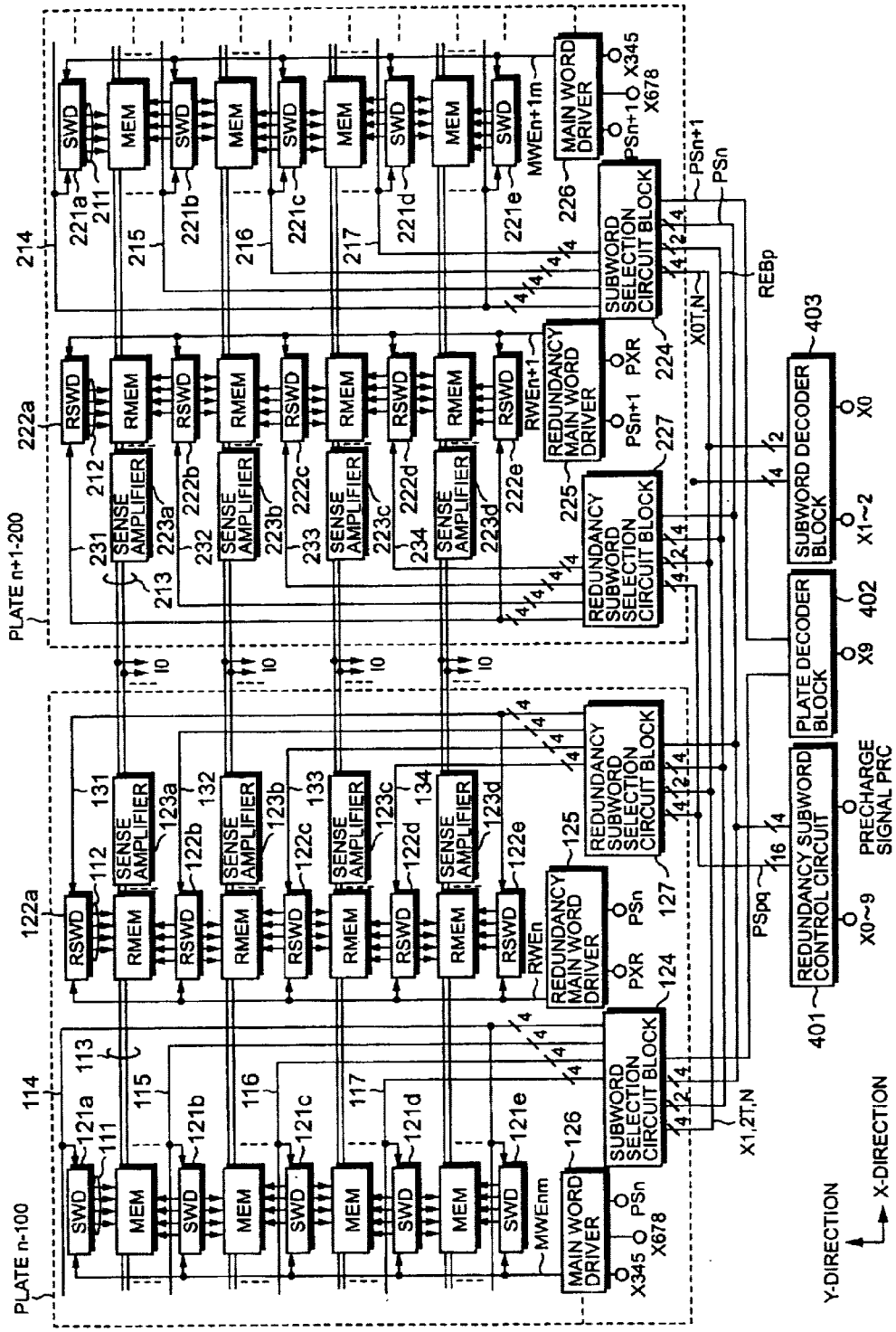
FIG. 5 is a block showing a structure of a portion corresponding to a related subword selection circuit.
Figure 6:
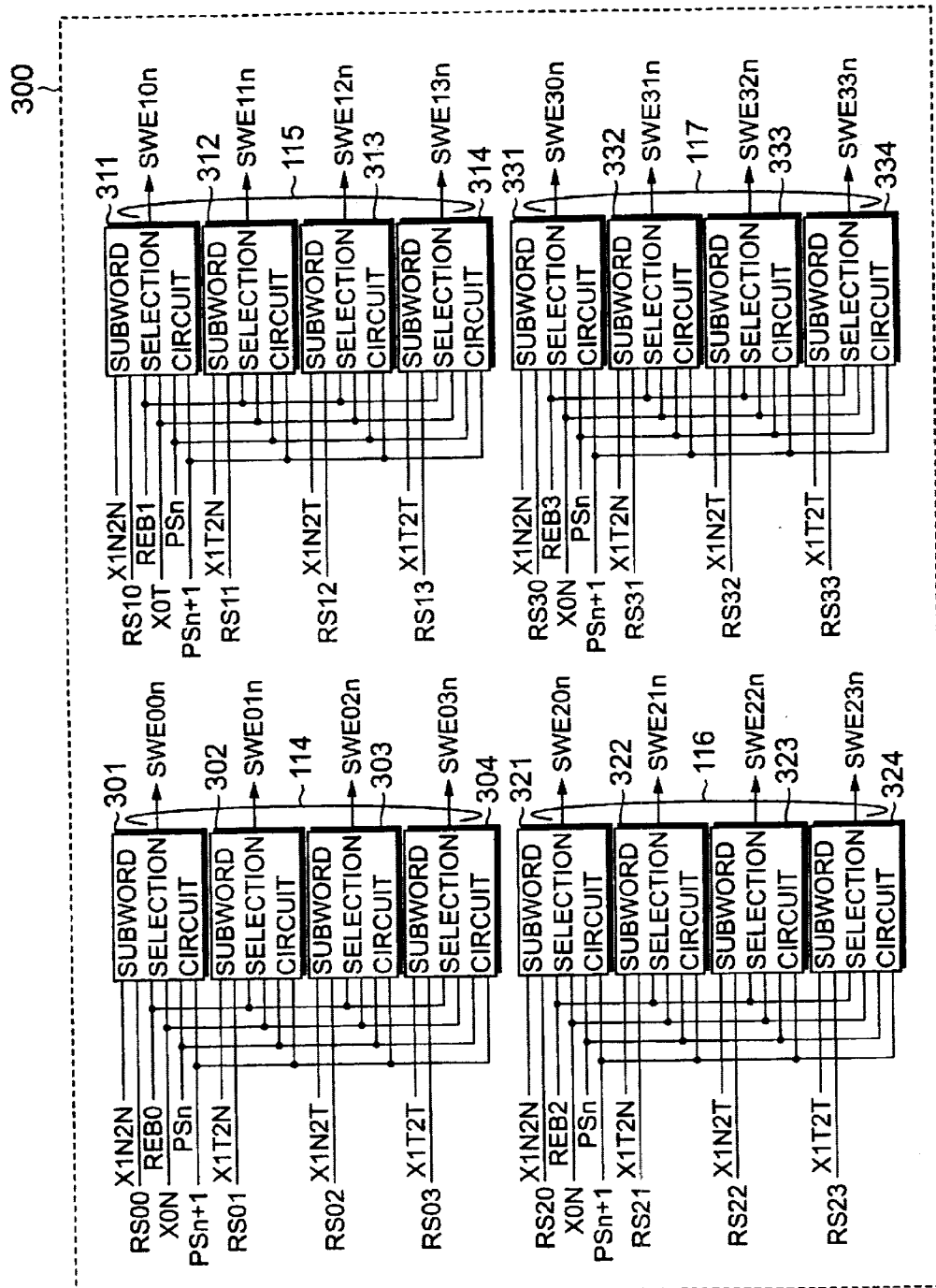
FIG. 6 is a structure diagram of a related subword selection circuit.
Figure 7:
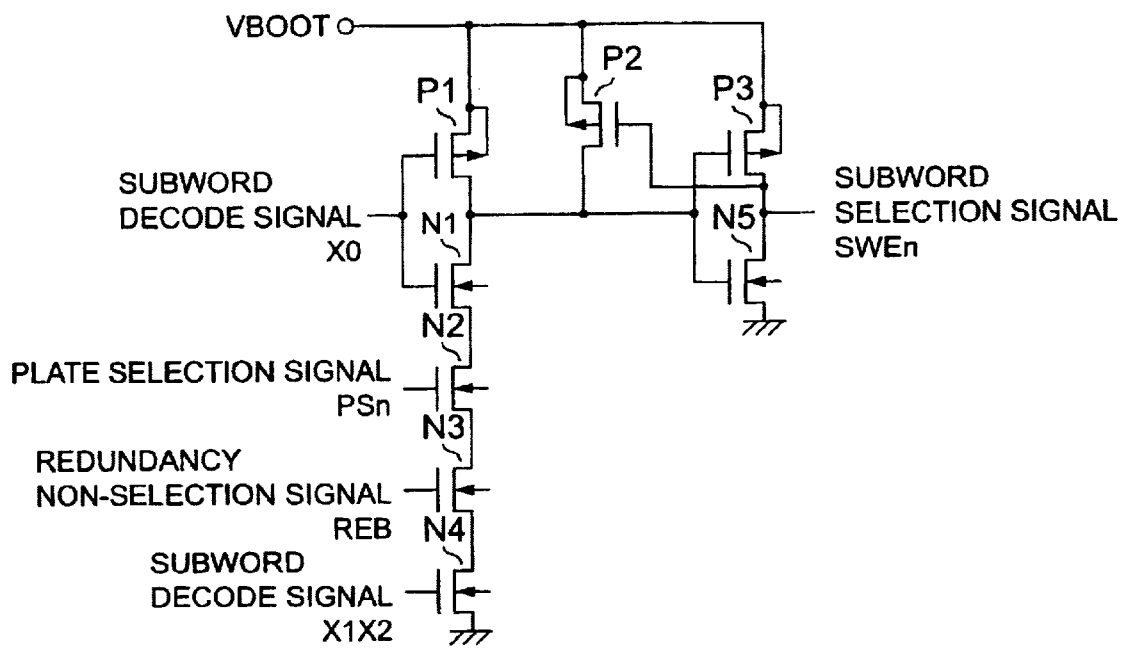
FIG. 7 is a circuit diagram of a related subword selection circuit.
Figure 8:
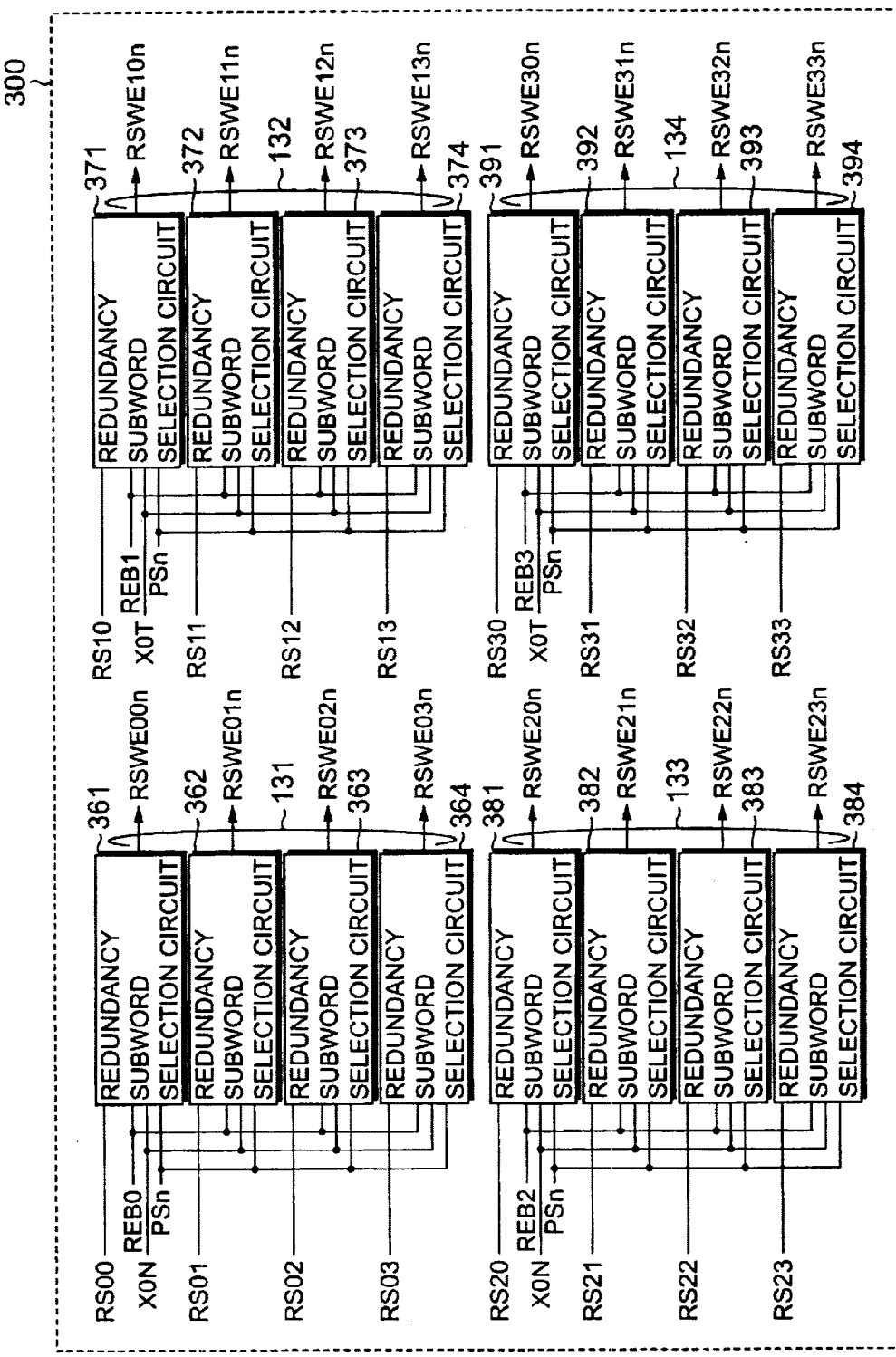
FIG. 8 is a structure diagram of a related redundant subword selection circuit.
Figure 9:
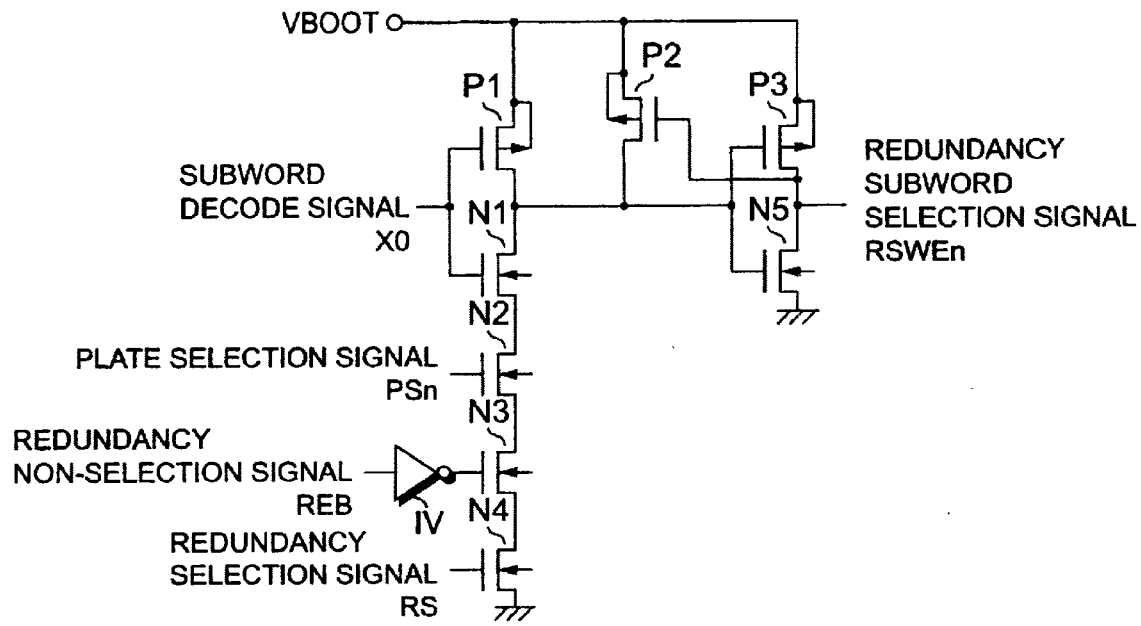
FIG. 9 is a circuit diagram of a related redundant subword selection circuit.
Figure 10:
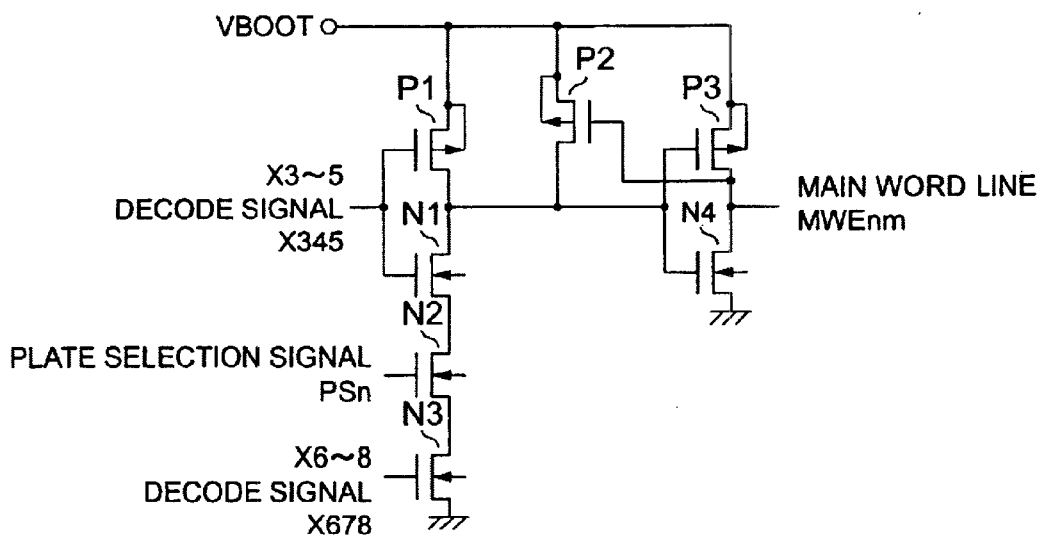
FIG. 10 is a circuit diagram of a related main word driver.
Figure 11:
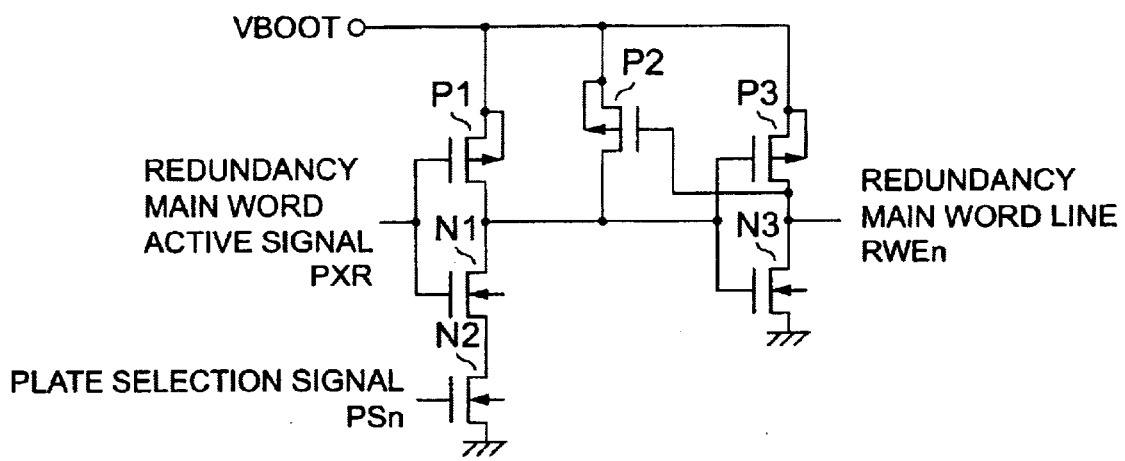
FIG. 11 is a circuit diagram of a related redundant main word driver.
Figure 12:
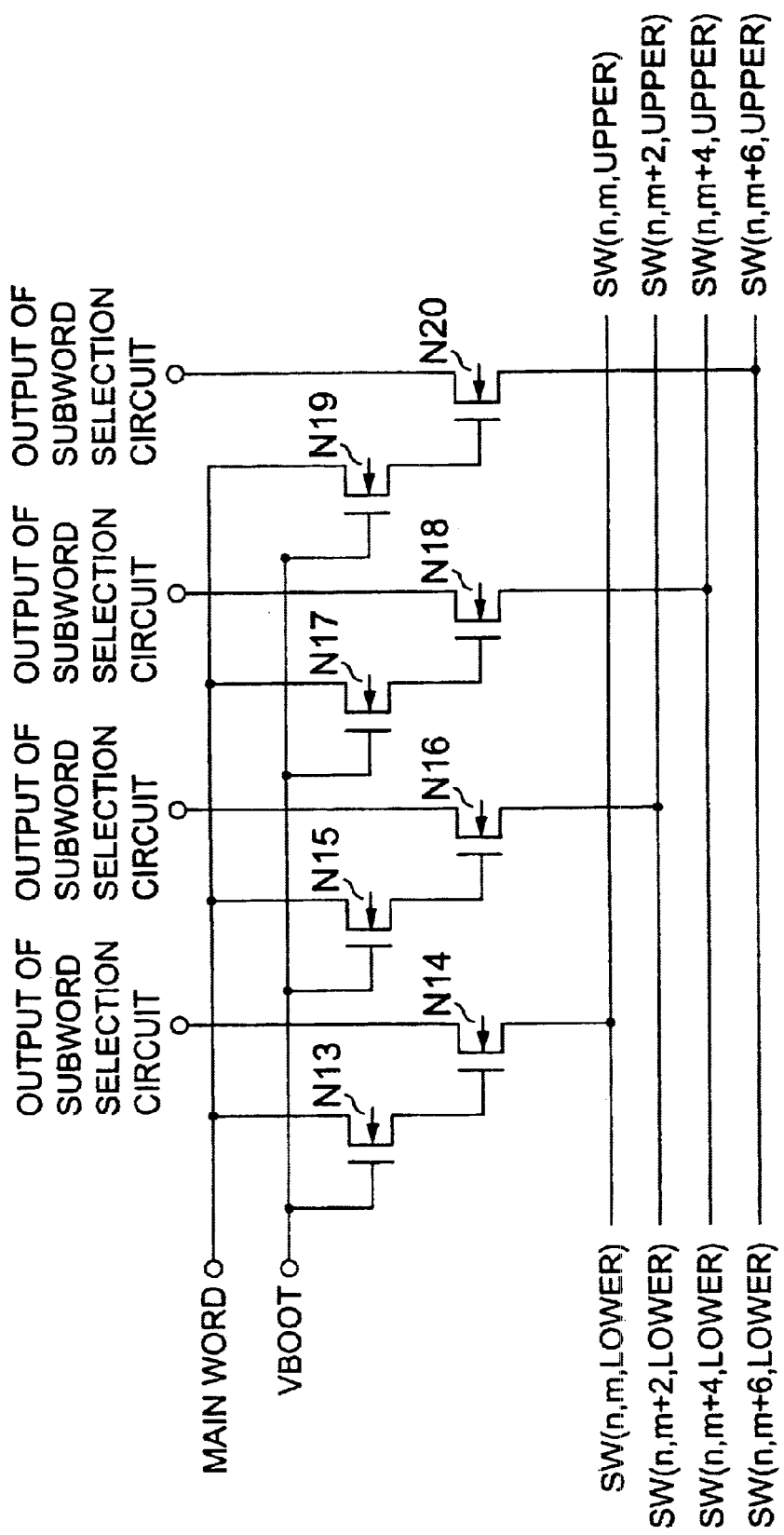
FIG. 12 is a circuit diagram of a related subword driver.
Figure 13A:
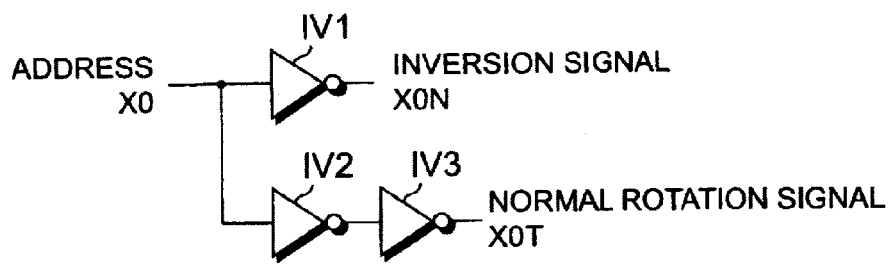
FIGS. 13A and 13B are circuit diagrams of a related subword decoder.
Figure 13B:
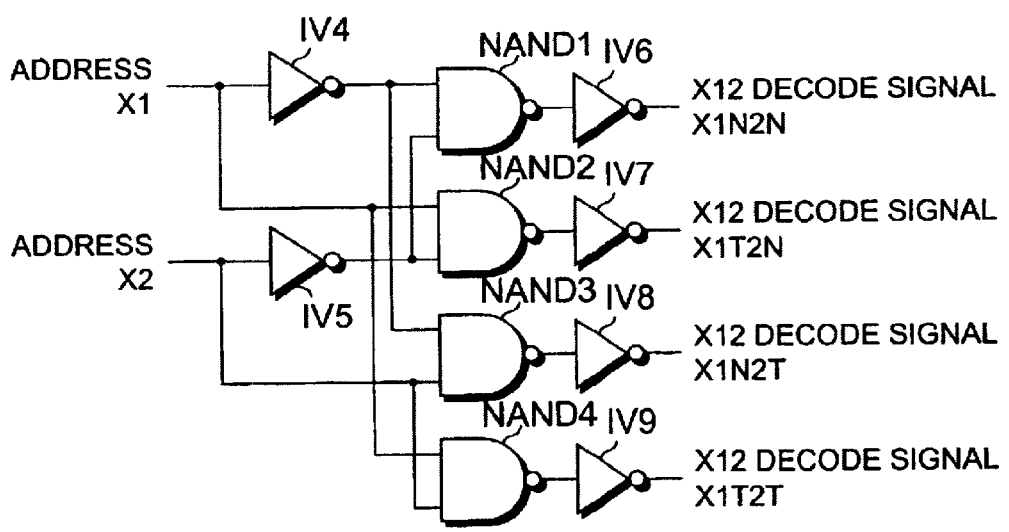
Figure 14:
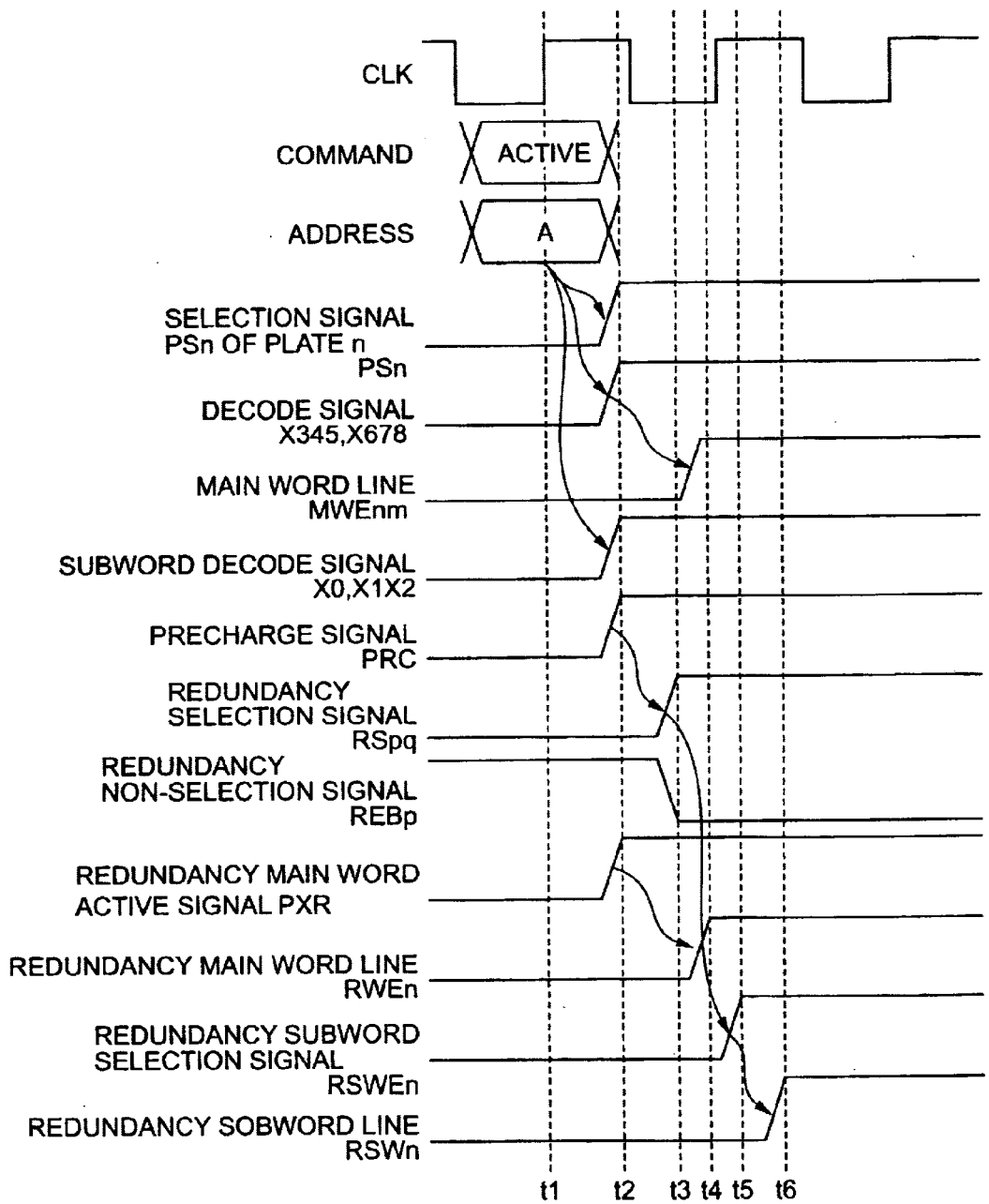
FIG. 14 is a timing chart explaining an operation of a related subword selection circuit.

Further, the redundant subword control circuit 401 has a fuse circuit illustrated in FIG. 2 and disclosed in Japanese unexamined Patent Publication No. 2000-100195.

With this structure, the redundant subword control circuit 401 detects a redundant address by a precharge signal PRC, and drives a redundant selection signal RSpq to select a redundant subword line bundle 112 of the plate n and a line bundle 212 of the plate n+1, and drives a redundant non-selection signal REBp not to select a line bundle 211 of the subword line of the plate n+1.

The redundant selection signal RSpq requires the above-mentioned 4 (subword lines)×4 (driver number)=16 to individually control the subword lines serving as the outputs of the subword drivers SED121a~121e. However, when the subword lines as the outputs of the subword drivers SWD121a~121e are not selected, the subword drivers SWD 121a~121e simultaneously become non-active.

Consequently, the number of the redundant non-selection signals REBp becomes 4. Herein, the same subword selection line signal (bundle 14 of lines) is provided to SWD 121a and 121e, respectively.

The plate decoder block 402 is provided with an address X9. It generates a plate selection signal PSn and the plate n+1 selection signal PSn+1, for the subword selection circuit blocks 124 and 224. Namely, the plate is selected by the plate selection signal PSn and the plate n+1 selection signal PSn+1 via the plate block 402.

The subword decoder block 403 is provided with addresses X1~X2. X0 generates a combination signal consisting of a normal rotation signal T of the decode signals X1 and X2, a polarity inverted signal N, the normal rotation signal T of the decode signal X0, and a polarity inversion signal N as X1N2N, X1T2N, X1N2T, and X1T2T, to the subword selection circuit blocks 124 and 224.

Herein, the normal rotation signal T of the decode signals X1 and X2, and a polarity inversion signal N is 4 in number on the basis of "L", "L"=0, "H", "L"=2, "I" "H"=1, "H" "H"=3 as a 2 bit combination of the normal rotation signal T and the polarity inversion signal N in the output line. The normal rotation signal T of the decode signal X0 and the polarity normal rotation signal N is 2 in number in the output line.

The subword selection circuit block 124 of the plate n has 4 of subword selection signals (SWE0n~SwE3n) lines (bundles 114~117 of lines) to select one subword line among bundle 111 of lines of the subword drivers SWD 121a~121e, and switches the selection with respect to 16 of subword selection signal lines 114~117 in total.

A redundant main word driver 125 is provided a redundant main word active signal PXR and the selection signal PSn of the plate n, and produces a redundant main word signal RWEn into redundant subword drivers RSWD 122a~122d.

A main word driver 125 is given a decode signal X345 of addresses X3, X4, X5, addresses X6, X7, X8, and a plate n selection signal PSn, and produces a main word signal MWEnm into a redundant subword drivers RSWD 122a~122d.

Subword drivers SWD 121a, 121c, and 121e produce subword signals SWn0, SWn2, and SWn4 into a memory cell corresponding to the normal rotation bit line T among bit line pairs of the memory cell array as bundle 111 of lines.

Subword drivers SWD 121b and 121d produce subword signals SWn1, SWn3, and SWn7 into a memory cell corresponding to an inverted line B among bit line pairs of the memory cell array as bundle 111 of lines. Namely, the word line is arranged in the comb form like the above-described related case.

Redundant subword drivers RSWD 122a, 122c, and 122e produce subword signals SWn0, SWn2, and SWn4 into the memory cell of the normal rotation bit line T of the memory cell array as bundle of lines 112.

Subword drivers SWD 122b and 122d produce subword signals SWn1, SWn3, SWn5, and SWn7 into the memory cell of the inversion bit line B of the memory cell array as bundle of lines 112.

In the meantime, the subword selection circuit block 224 of the plate n+1 has subword selection signals (SWE0n~SWE3n) 214~217, each of which is structured by 4 lines, to select one subword line from a subword line bundle 111 of subword drivers SWD 221a~221e. With this structure, the selection of subword selection signals 214~217 as 16 lines in total are switched.

A redundant main word driver 225 is provided with a redundant main word active signal PXR and a selection signal PSn+1 of the plate n+1, and produces a redundant main word signal RWEn+1 into redundant subword drivers RWS 222a~222d.

A main word driver 226 is given a decode signal X345 of addresses X3, X4, X5, addresses X6, X7, X8, and a selection signal PSn+1 of the plate n+1, and produces a main word signal MWEn+1 m into redundant subword drivers 222a~222d.

Subword drivers SWD 221a, 121c, and 121e produce subword signals SWn1, SWn3, and SWn5 into the memory cell corresponding to the inversion bit line B of the memory cell array as bundle of lines 211.

Subword drivers SWD 221b and 221d produce subword signals SWn0, SWn2, SWn4 and SWn6 into the memory cell corresponding to the normal rotation line T of the memory cell array as bundle of lines 211. In this case, the word line is arranged in the comb form as in the above-mentioned related case.

Redundant subword drivers RSWD 222a, 222c, and 222e produce subword signals SWn1, SWn3, and SWn5 into the memory cell of even number lines of the memory cell array as the bundle of lines 212.

Subword drivers SWD 222b and 222d produce subword signals SWn0, SWn2, SWn4, and SWn6 into the memory cell of odd number lines of the memory cell array as the bundle of lines 212.

This feature of this invention will be explained as follows.

Namely, the redundant subword selection signals 214~217 for selecting one subword from the line bundle 112 of the redundant subword lines are supplied through a node N2 from the subword selection signals 214~217 generated from a subword selection circuit block 224 of a plate n+1–200.

Further, the line bundles 114~117 of the redundant subword selection signals provided to the redundant subword drivers RSWD 222a~222e of the plate n+1–200 are supplied from the bundle 212 of the redundant subword lines.

The redundant subword selection signals 214~217 for selecting one subword from the line bundle 212 of the redundant subword lines are supplied via the node N1 from the subword selection signals 214~217 generated from the subword selection circuit block 124 of the plate n+1–200.

More specifically, the subword selection circuits for switching the selection of the subword selection lines are arranged at every plate. Each of the respective subword selection circuits has a selection unit which selects the subword selection line on the plate belonging thereto and the redundant subword selection line of the redundant memory cell array placed on the other adjacent plate.

A data signal from the memory cell is read via the bit line 113, is amplified by a sense amplifier 123, and is produced for a buffer (not shown).

Herein, each of the above-mentioned redundant subword control circuit 401, the plate decoder block 402, the subword decoder block 403, the redundant main word drivers 125, 225, the main word drivers 126, 226, the subword drivers 121a~121d, 221a~221d, and the redundant subword drivers 121a~121d, 221a~221d has the same circuit structure as the above-described related circuit. Therefore, the description thereof will be hereinafter omitted.

Figure 16:
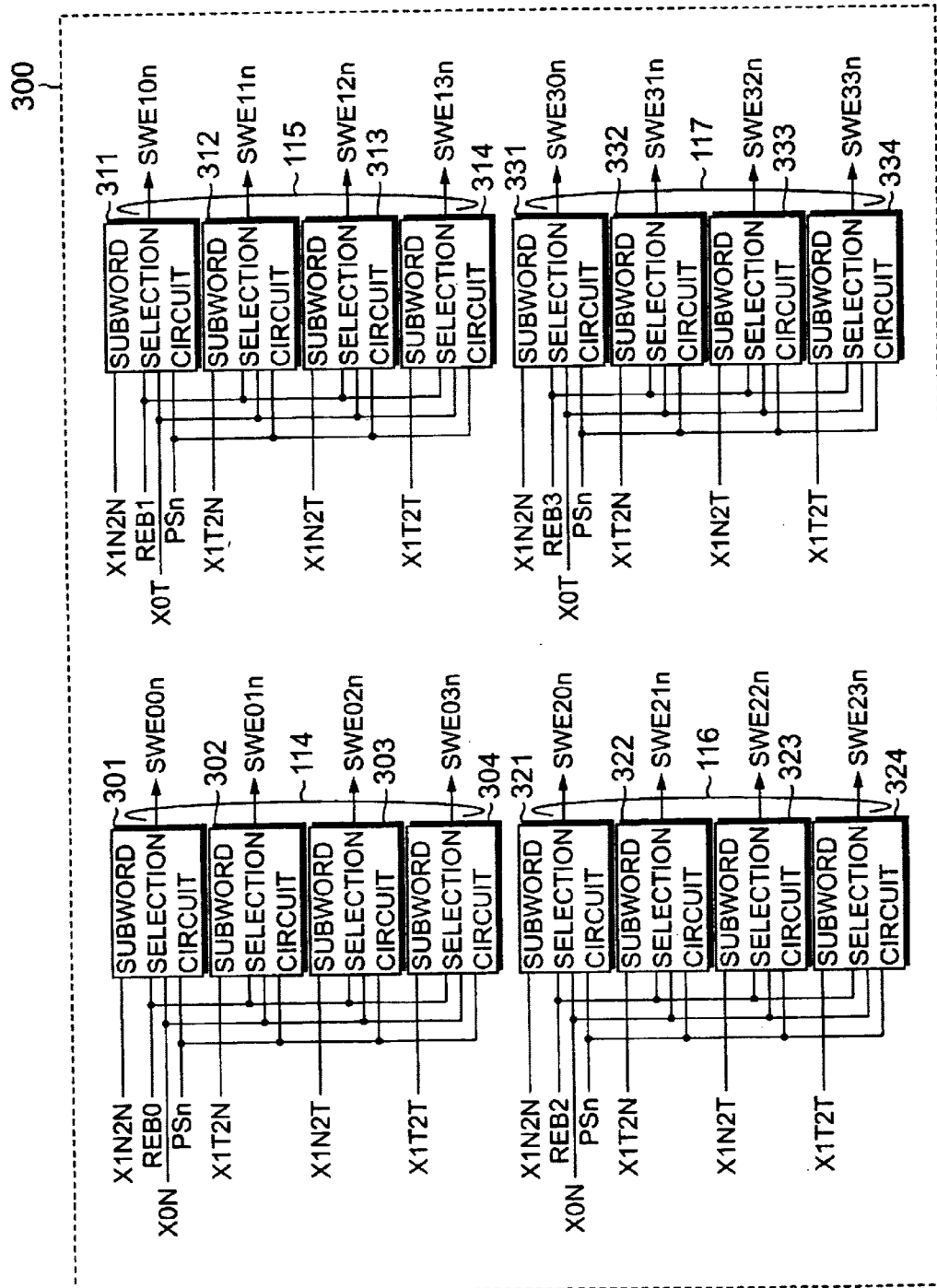
FIG. 16 is a block diagram of a subword selection circuit block.

Referring now to FIG. 16, the subword selection circuit block 124 is provided with a subword selection circuit 301, a subword selection circuit 302, a subword selection circuit 303, and subword selection circuit 304.

The subword selection circuit 301 is provided with a subword decode signal X1N2N, the redundant selection signal RS00, a redundant non-selection signal REB0 serving as a common input signal, a subword decode signal X0N, a selection signal PSn of the plate n, and a selection signal PSn+1 of the plate n+1, and produces a subword selection signal SWE00n.

The subword selection circuit 302 is provided with a subword decode signal X1T2N, the redundant selection signal RS01, and a common input signal, and produces a subword selection signal SWE01n.

The subword selection circuit 303 is provided with a subword decode signal X1N2T, the redundant selection signal RS02, and a common input signal, and produces a subword selection signal SWE02n.

The subword selection circuit 304 is provided with a subword decode signal X1T2T, the redundant selection signal RS03, and a common input signal, and produces a subword selection signal SWE03n.

With such a structure, the subword selection signals SWE00n, SWE01n, SWE02n, and SWE3n constitute bundle of lines 114.

Further, the subword selection circuit block 124 is provided with a subword selection circuit 311, a subword selection circuit 312, a subword selection circuit 313, and subword selection circuit 314.

The subword selection circuit 311 is provided with a subword decode signal X1N2N, the redundant selection signal RS10, a redundant non-selection signal REB0 serving as a common input signal, a subword decode signal X0T, a selection signal PSn of the plate n, and a selection signal PSn+1 of the plate n+1, and produces a subword selection signal SWE10n.

The subword selection circuit 312 is provided with a subword decode signal X1T2N, the redundant selection signal RS11, and a common input signal, and produces a subword selection signal SWE11n.

The subword selection circuit 313 is provided with a subword decode signal X1N2T, the redundant selection signal RS12, and a common input signal, and produces a subword selection signal SWE12n.

The subword selection circuit 314 is provided with a subword decode signal X1T2T, the redundant selection signal RS13, and a common input signal, and produces a subword selection signal SWE13n.

With this structure, the subword selection signals SWEL10n, SWE11n, SWE12n, and SWE13n constitute bundle of lines 115.

Moreover, the subword selection circuit block 124 is provided with a subword selection circuit 321, a subword selection circuit 322, a subword selection circuit 323, and subword selection circuit 324.

The subword selection circuit 321 is provided with a subword decode signal X1N2N, the redundant selection signal RS20, a redundant non-selection signal REB2 serving as a common input signal, a subword decode signal X0N, a selection signal PSn of the plate n, and a selection signal PSn+1 of the plate n+1, and produces a subword selection signal SWE20n.

The subword selection circuit 322 is provided with a subword decode signal X1T2N, the redundant selection signal RS21, and a common input signal, and produces a subword selection signal SWE21n.

The subword selection circuit 323 is provided with a subword decode signal X1N2T, the redundant selection signal RS22, and a common input signal, and produces a subword selection signal SWE22n.

The subword selection circuit 324 is provided with a subword decode signal X1T2T, the redundant selection signal RS23, and a common input signal, and produces a subword selection signal SWE23n.

With such a structure, the subword selection signals SWE20n, SWE21n, SWE22n, and SWE23n constitute bundle of lines 116.

In addition, the subword selection circuit block 124 is provided with a subword selection circuit 331, a subword selection circuit 332, a subword selection circuit 333, and subword selection circuit 334.

The subword selection circuit 331 is provided with a subword decode signal X1N2N, the redundant selection signal RS30, a redundant non-selection signal REB3 serving as a common input signal, a subword decode signal X0T, a selection signal PSn of the plate n, and a selection signal PSn+1 of the plate n+1, and produces a subword selection signal SWE30n.

The subword selection circuit 332 is provided with a subword decode signal X1T2N, a redundant selection signal RS31, and a common input signal, and produces a subword selection signal SWE31n.

The subword selection circuit 333 is provided with a subword decode signal X1N2T, a redundant selection signal RS32, and a common input signal, and produces a subword selection signal SWE32n.

The subword selection circuit 334 is provided with a subword decode signal X1T2T, a redundant selection signal RS33, and a common input signal, and produces a subword selection signal SWE33n.

With this structure, the subword selection signals SWE30n, SWE31n, SWE32n, and SWE33n constitute bundle of lines 117.

Namely, the subword selection signals (bundle 114 of lines) generated from the subword selection circuit block 124 is composed of 4×4=16 (SWE00n~SWE33n).

Figure 17:
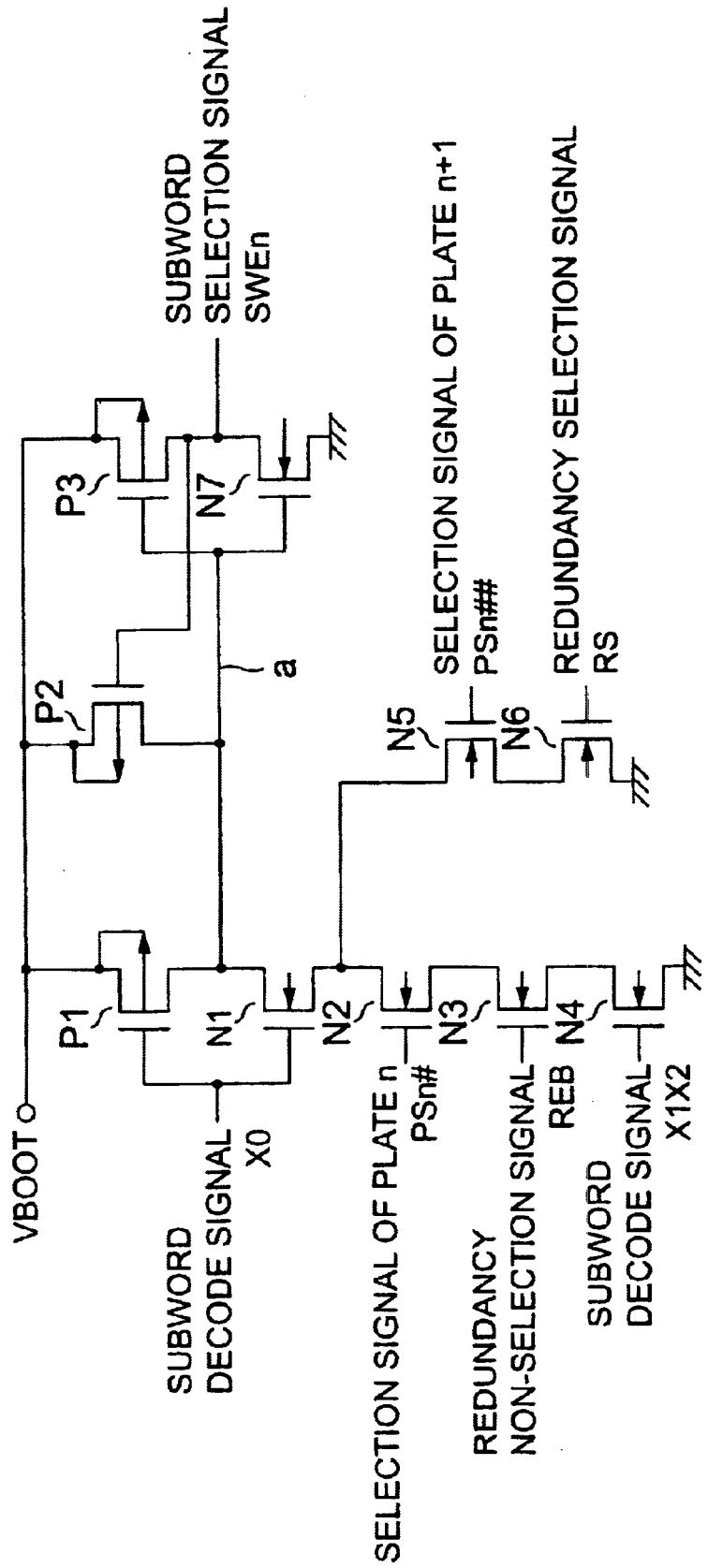
FIG. 17 is a circuit diagram of a subword selection circuit.

Referring to FIG. 17, each of the subword selection circuits 301~334 includes a first CMOS inverter having a p-channel MOS transistor P1 and an N-channel MOS transistor N1 which are given the subword decode signal X0.

With this structure, an N-channel MOS transistor N2 and an N-channel MOS transistor N3, and an N-channel MOS transistor N4 are connected in series between the source of an N-channel MOS transistor N1 of the inverter and the ground potential.

Herein, the N-channel MOS transistor N2 is provided with the selection signal PSn# of the first plate n while the N-channel MOS N3 transistor is provided with the redundant non-selection signal REB. Further, the N-channel MOS transistor N4 is provided with the subword decode signal X1X2.

Under this circumstances, the output of the first MOS inverter is pulled up to the power source potential VBOOT via the P-channel transistor P2, and is supplied to a second MOS inverter consisting of a p-channel MOS transistor P3 and an N-channel MOS transistor N7. The output thereof is produced as the subword line selection signal SWEn, and is provided with the gate of the P-channel transistor P2.

In this condition, the serial connection of a fourth N-channel MOS transistor N5 provided with the selection signal PSn## of the plate n+1 and an N-channel MOS transistor N6 provided with the redundant selection signal RS is connected to the serial connection of the N-channel MOS transistors N2, N3, and N4 in parallel.

Similarly, the subword selection signal (a line bundle 115) of the plate n becomes the subword selection signals SWE10n~SWE13n illustrated in FIG. 16. The subword selection signal (a line bundle 116) becomes the subword selection signals SWE20n~SWE23n as illustrated in FIG. 16. The subword selection signal (a line bundle 117) becomes the subword selection signals SWE30n~SwE33n as illustrated in FIG. 16.

The subword decode signals X0N, X0T shown in FIG. 16 are connected in accordance with X0 in the subword selection circuit diagram as illustrated in FIG. 17. For example, X0n of the subword selection circuits 301~304 illustrated in FIG. 16 are connected as the subword decode signal X0 as illustrated in FIG. 17.

Further, X0T of the subword selection circuits 311~314 illustrated in FIG. 16 is connected as the subword decode signal X0 as illustrated in FIG. 17.

Likely, the subword decode signals X1N2N~X1T2T correspond to the subword decode signal X1X2 in the subword selection circuit diagram as illustrated in FIG. 17.

Further, the redundant selection signals RS00~RS33 and the redundant non-selection signals REB0~REB3 as illustrated in FIG. 16 are connected in accordance with the redundant selection signal RS and the redundant non-selection signal REB illustrated in FIG. 17, respectively. Moreover, the subword selection signals SWE00~SWE33n are connected in accordance with the subword selection signal SWEn illustrated in FIG. 17.

Subsequently, description will be made about the connection of the plate n, n+1 selection signal PSn, PSn+1 to the subword selection blocks 124, 224 with reference with FIGS. 15 through 18.

More specifically, the subword selection circuit block 124 is arranged in the plate n. Consequently, the plate n selection signal PSn provided to the subword selection circuit 124 is connected to the selection signal PSn# of the plate n illustrated in FIG. 17, and the plate n+1 selection signal PSn+1 is connected to the selection signal Psn# of the plate n+1 as illustrated in FIG. 17.

Further, the subword selection circuit block 224 is arranged in the plate n+1. In consequence, the plate n+1 selection signal PSn+1 provided to the subword selection circuit block 224 is connected to the input terminal of the selection signal PSn# of the plate n as illustrated in FIG. 17 while the plate n selection signal Psn is connected to the input terminal of the selection signal PSn## of the plate n+1 as illustrated in FIG. 17.

Subsequently, an input corresponding relationship of the plate selection signal Psn, Psn+1 in the subword selection circuit block 224 arranged in the subword selection circuit block 124 placed in the plate n and the subword selection circuit block 224 placed in the plate n+1 will be represented as follows.

|  | PSn# terminal | Psn## terminal |
|---|---|---|
| connection during the plate n selection | PSn | PSn + 1 |
| connection during the plate n + 1 selection | PSn + 1 | PSn |

Namely, in the case where the plate n is selected, the subword selection circuit (inside the subword selection circuit block 124) is provided with the plate selection signal PSn as the input signal of the PSn# terminal while the plate n+1 selection signal PSn+1 is provided as the input signal of the PSn## terminal.

Further, in the case where the plate n+1 is selected, the subword selection circuit (inside the subword selection circuit block 224) is given the plate selection signal PSn+1 as the input signal of the PSn# terminal while the plate n selection signal PSn is given as the input signal of the PSn## terminal.

VBOOT in FIG. 17 is a boot power supply voltage. In this case, the power supply voltage VCC is equal to 3.3 V while the boot power supply voltage VBOOT is equal to 4.0 V.

Although the boot power supply voltage VBOOT is not shown in the subword selection circuits 301~334 in the subword selection circuit block diagram illustrated in FIG. 16, it is supplied from the external of the block. The plate power supply voltage VBOOT in the other circuit diagram is supplied in the similar manner.

Subsequently, description will be made about the operation of the subword selection circuit with reference to FIG. 17.

First, a case in which the plate n is selected and is not replaced will now be described.

The plate n selection signal PSn# is put into an "H" level, and the N-channel MOS transistor N2 is turned on to put it into the conductive state. The N-channel MOS transistor N3 is put it into the conduction state because the redundant non-selection signal REB is put into an "H" level.

The N-channel MOS transistor N5 is turned off, putting it into the non-conductive state because the plate n+1 selection signal PSn## is put into an "L" level.

The N-channel MOS transistor is turned off, putting it into the non-conductive state because the redundant selection signal RS is equal to an "L" level.

The subword decode signal X0 of the subword selection circuit selected by the subword decode signal due to the addresses X0~X2 becomes an "H" level, and the subword decode signal X1X2 becomes an "H" level.

Thereby, the N-channel MOS transistor N1 is turned on to put it into the conductive state, and the N-channel MOS transistor N4 is turned on to put it into the conductive state. The P-channel MOS transistor P1 is turned off to put it into the non-conductive state.

The node a is put into an "L" level. In consequence, the p-channel MOS transistor P3 is turned on to put it into the conductive state, and the N-channel MOS transistor N7 is turned off to put it into the non-conductive state. The selected subword selection signal SWEn is put into an "H" level.

The subword selection signal SWEn becomes one of the subword selection signals (bundles 114~117 of lines) used to select the subword line of the plate n−100.

Subsequently, a case in which the plate n is selected and is replaced will now be described.

The plate n selection signal PSn# is put into an "H" level, and the N-channel MOS transistor N2 is turned on to put it into the conductive state. The redundant non-selection signal REB is put into an "L" level, and the N-channel MOS transistor N3 is turned off, putting it into the non-conductive state.

The plate n+1 selection signal PSn## is put into an "L" level, and the N-channel MOS transistor N5 is turned on to put it into the non-conductive state. The redundant non-selection signal RS is put into an "H" level, and the N-channel MOS transistor N6 is turned off, putting into the conductive state.

Even when the subword decode signal X0 becomes an "H" level, the node a is equal to an "H" level. Further, the P-channel MOS transistor P3 is turned off to put it into the non-conductive state, and the N-channel MOS transistor N7 is turned on to put it into the conductive state, and the subword selection signal SWEn of the plate n is put into an "L" level.

However, the plate n selection signal Ps## of the subword selection circuit of the plate n+1 is put into an "H" level, and the N-channel MOS transistor N5 is turned on to put it into the conductive state. Further, the redundant selection signal RS is put into an "H" level, and the N-channel MOS transistor N6 is turned on to put it into the conductive state. Thereby, the node a of the subword selection circuit of the plate n+1 becomes an "L" level, and the subword selection signal SWEn is put into an "H" level.

As illustrated in FIG. 15, the redundant subword selection signal utilizes the subword selection signal of the plate n+1. Consequently, the redundant subword line will be selected.

Figure 18:
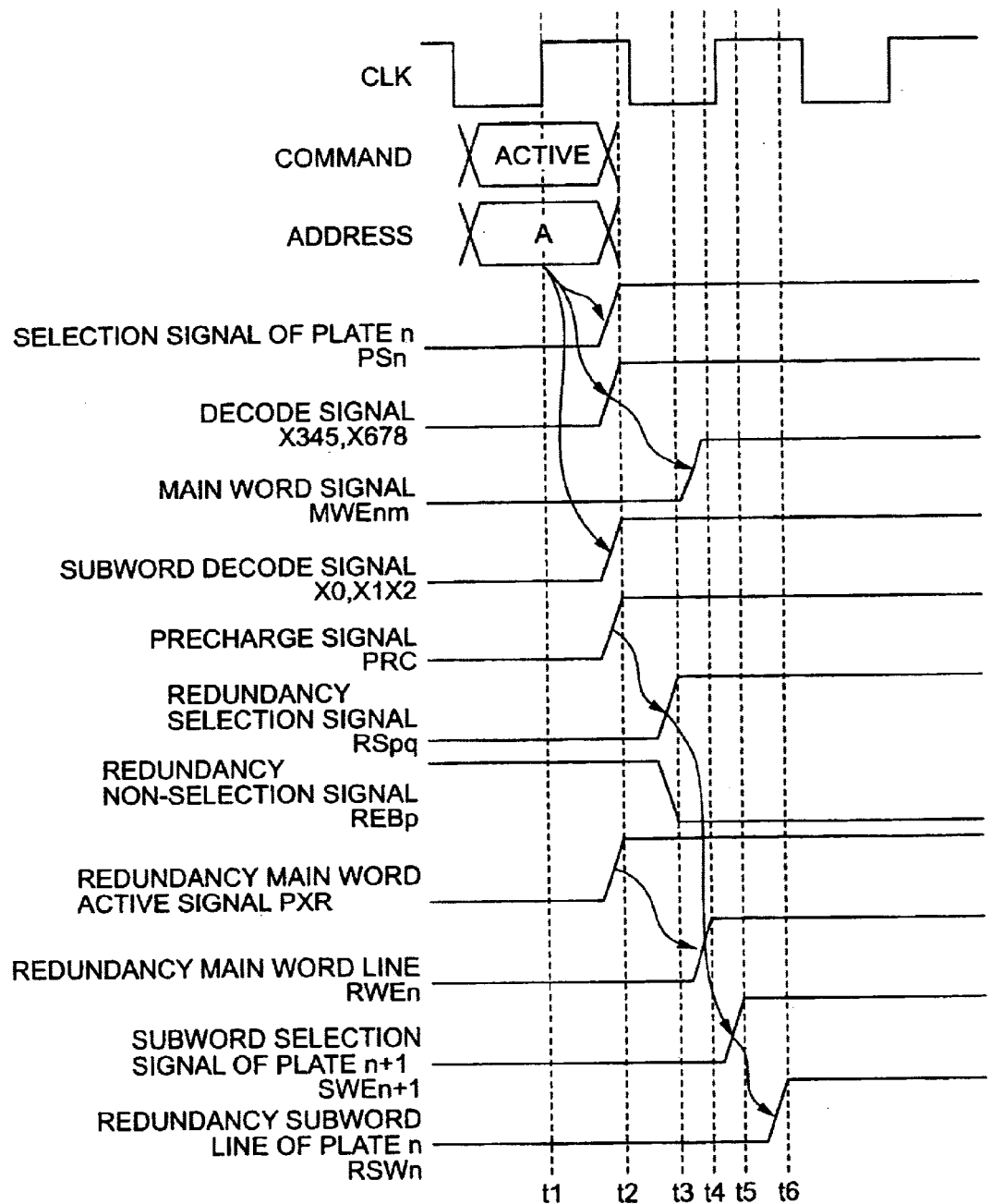
FIG. 18 is a timing chart explaining an operation of a subword selection circuit.

Subsequently, the operation of the subword selection circuit will now be described, with reference to FIG. 18.

At time prior to time T1, the precharge state appears, and all of the subword decode signals X0~X9 are put into "L" levels. Herein, the address 9 is set so as to select the plate n.

At time t1, the command and the address are synchronized with a rising timing of the clock. Herein, the command referred to as "active" serves to select the word.

At time t2, the selection signal PSn of the plate n becomes an "H" level, and the decode signals X345 and X678 of the addresses X3, X4, X5 and X6, X7, X8 become "H" levels. Further, X0 and X1X2 serving as the subword decode signals become "H" levels, respectively.

The redundant main active signal PXR becomes an "H" level, and the precharge signal PRC becomes an "H" level. Under such a circumstance, when the redundant address is detected and replaced, at time t3, the redundant selection signal RSpq becomes an "H" level while the redundant non-selection signal REBp becomes an "L" level.

At time t4, the main word driver MWEnm selected by the decode signals X345 and X678 of X3, X4, X5 and X6, X7, X8 becomes an "H" level while the redundant main word line RWEn becomes an "H" level.

At time t5, the subword selection signal SWEn of the plate n is not generated, and the subword selection signal SWEn+1 of the plate n+1 is generated.

At time t6, the redundant subword line RSWn, which commonly uses the subword selection line of the plate n+1, is selected.

When not replacing, the same operation is performed until the precharge signal PRC at timing t2 becomes an "H" level. At time t2, the redundant main word active signal PXR is kept at an "L" level.

At time t3, the redundant selection signal RSpq is kept to an "H" level, and the redundant non-selection signal REBp becomes an "H" level.

At time t4, the main word signal MWEnm selected by the decode signals X345 and X678 of X3, X4, X5 and X6, X7, X8 is kept to an "H" level, and the redundant main word line RWEn is kept to an "L" level.

At time t5, the subword selection signal of the plate n is generated, and the subword selection signal SWE n+1 of the plate n+1 is not generated.

At time t6, the subword line SWn of the plate n is selected.

According to the first embodiment, the layout area can be reduced. More specifically, the redundant subword selection signal RSWEn of the plate n is generated by the use of the adjacent subword selection circuit 224.

Further, the redundant subword selection signal RSWEn+1 of the plate n+1 is generated by the use of the adjacent subword selection circuit 124 of the plate n.

These signals are crossing between the plates, and are inputted to the redundant subword driver RWD of the plate n to perform the replacement.

Namely, the subword selection circuits of the adjacent plate n, n+1 are commonly used between the plates. Thereby, 16 of the redundant subword selection signals specific to the conventional redundant, which are arranged in the memory cell array, and 16 of the specific redundant subword selection circuits placed in the existing subword selection circuit can be eliminated for one entire plate.

Moreover, as the secondary effect, the chip size becomes small. In consequence, the package size and the mounting size can be reduced. Thereby, the consumption current becomes small. As a result, market competitiveness can be increased.

According to the first embodiment, description has been made about one unit of the redundant circuits consisting of one of the redundant main word line for one plate. However, this invention is not restricted to the embodiment, and is readily applicable for such a case in which two or more units of the redundant circuits having two or more of the redundant main word lines are arranged.

More specifically, there is provided a plurality of redundant main word drivers 125 and 225, and a plurality of units of the redundant circuit corresponding to redundant main word drivers 125 and 225. With this structure, the redundant main word driver 125 is commonly given with the redundant main word active signal PXR and the selection signal PSn of the plate n.

Further, the redundant main word driver 225 is commonly given with the redundant main word active signal PXR and the selection signal PSn+1 of the plate n+1.

Moreover, the subword selection signal (bundles 114~117 of lines and bundles 214~217 of lines) is given to the corresponding redundant circuits, respectively. In this event, the defective chip relieving rate due to the replacement can be increased.

Figure 19:
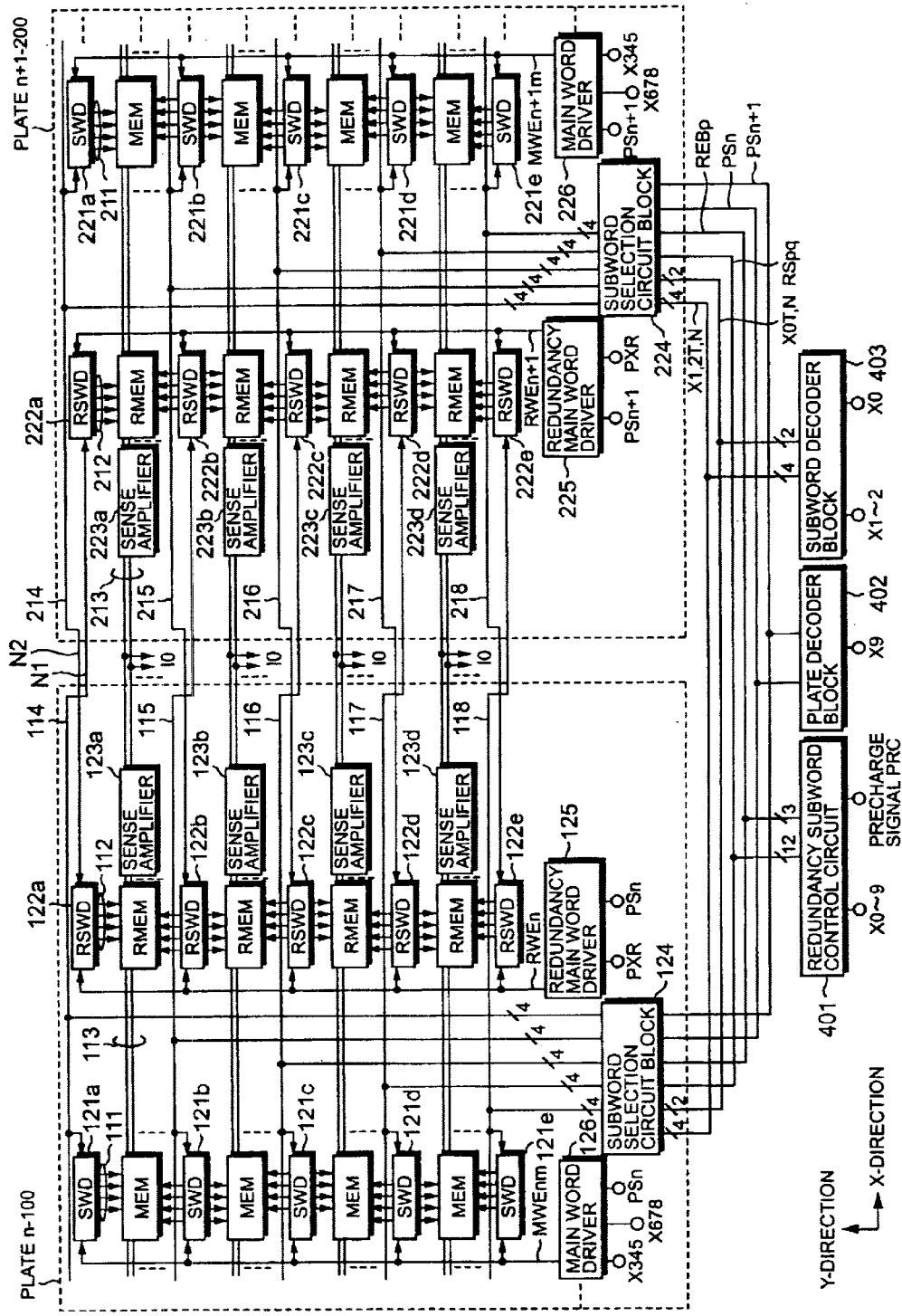
FIG. 19 a block diagram showing a subword selection circuit of a semiconductor memory device according to a second embodiment of this invention.

Subsequently, a second embodiment will now be described with reference to FIGS. 19 through 21.

Figure 21:
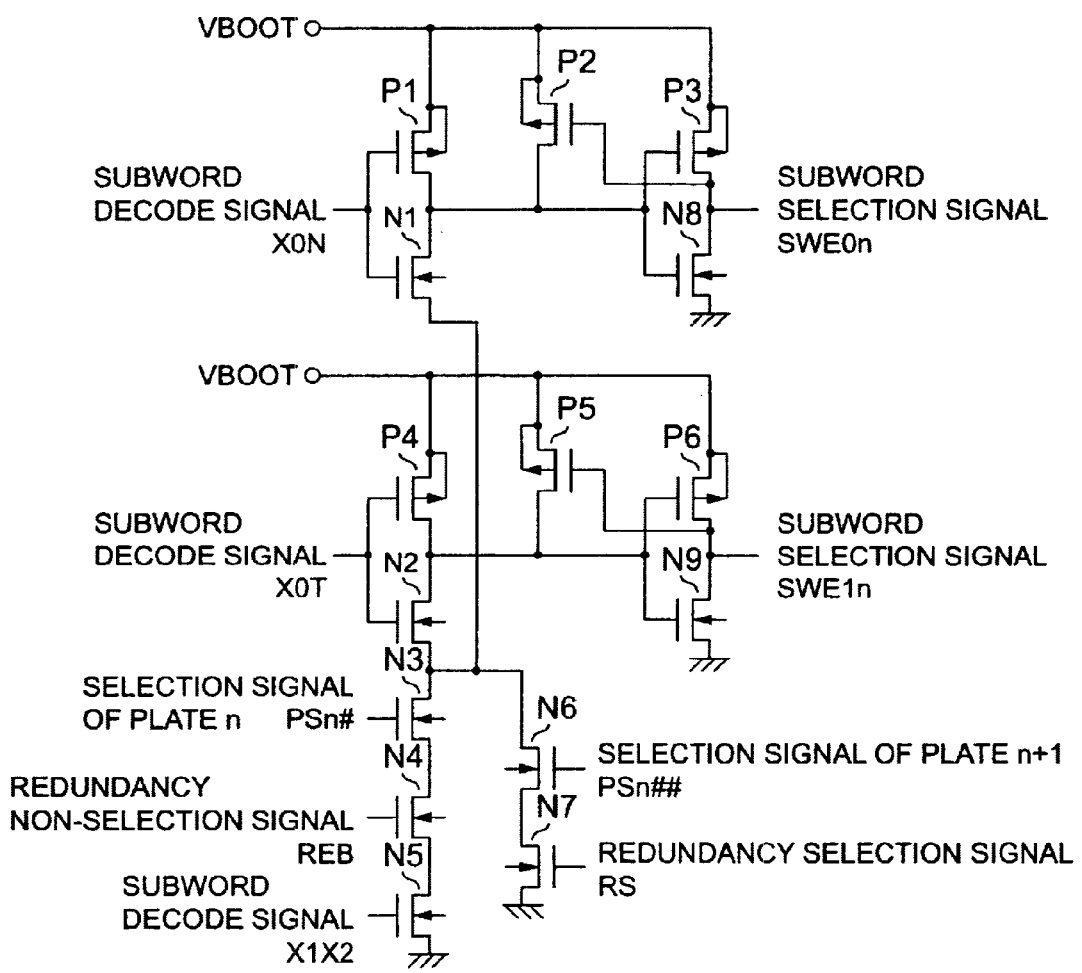
FIG. 21 is a circuit diagram of a subword selection circuit according to a second embodiment.

Referring now to FIG. 21, in a subword selection circuit, a first CMOS inverter, an N-channel MOS transistor N3, an N-channel MOS transistor N4, and an N-channel MOS transistor N5 are connected in series.

Herein, the first CMOS inverter is composed of a p-channel MOS transistor P4 and an N-channel MOS transistor N2 which are provided with a subword decode signal X0T.

An N-channel MOS transistor N3, and an N-channel MOS transistor N4 and an N-channel MOS transistor N5 are connected in series between the source of the N-channel MOS transistor N2 and the ground potential.

With such a structure, the N-channel MOS transistor N3 is provided with the selection signal PSn# of the plate n. The N-channel MOS transistor N4 is provided with the redundant non-selection signal REB. The N-channel MOS transistor N5 is provided with the subword decode signal X1X2.

Further, the output of the first MOS inverter is pulled-up to the power supply potential VBOOT by a P-channel MOS transistor P5, and is supplied to a second MOS inverter consisting of a P-channel MOS transistor P6 and an N-channel MOS transistor N9.

The output of the second MOS inverter is produced as a subword line selection signal SWE1$n$, and the output is provided with to the gate of the P-channel transistor P5.

Moreover, the serial connection body consisting of the N-channel MOS transistors N3, N4 and N5 is connected to a serial connection body consisting of an N-channel MOS transistor N6 and an N-channel MOS transistor N7 in parallel.

Herein, the N-channel MOS transistor 6 is provided with the selection signal PSn# of the plate n+1 while the N-channel MOS transistor N7 is provided with the redundant selection signal RS.

In addition, a third CMOS inverter is composed of the P-channel MOS transistor P1 and the N-channel MOS transistor N1 which are provided with a polarity inversion signal X0N of the subword decode signal between the source of the N-channel MOS transistor N2 of the first CMOS inverter and the power supply potential.

With this structure, the output of the third MOS inverter is pulled-up to the power supply potential via a P-channel MOS transistor P2. The output of the P-channel MOS transistor P2 is supplied to a fourth MOS inverter consisting of a P-channel MOS transistor P3 and an N-channel MOS transistor N8. The output of the fourth MOS inverter is produced as a subword line selection signal SWE0n, and the output is provided with to the gate of the P-channel MOS transistor P2.

In such a subword selection circuit, the switching of the subword selection signal SWE0n and SWE1n due to the switching of X0T and X0N serving as the subword decode signal is carried out by two subword selection circuits in the first embodiment.

By contrast, the switching can be performed by one subword selection circuit, and thereby, this part of the circuit can be commonly used in the second embodiment.

Namely, the selection signal PSn# of the plate n, the selection signal PSn of the plate n+1, the redundant non-selection signal REB, the redundant selection signal RS, and the subword signal X1X2 can be commonly used.

Figure 20:
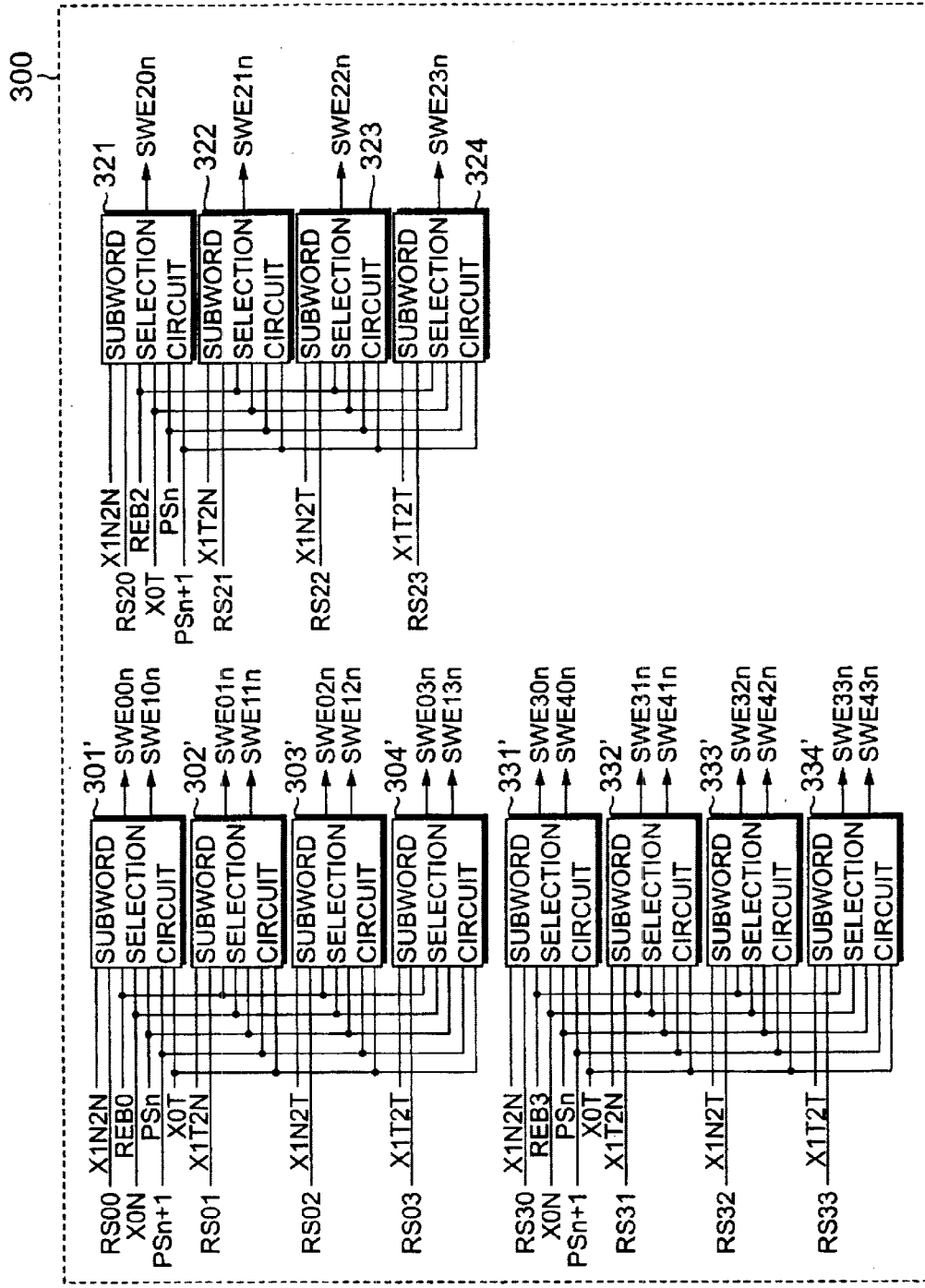
FIG. 20 is a structure diagram of a subword selection circuit according to a second embodiment.

Referring to FIG. 20, the subword selection circuit block comprises a subword selection circuit 301', a subword selection circuit 302', a subword selection circuit 303', and a subword selection circuit 304'.

Herein, the subword selection circuit 301' is provided with the subword decode signal X1N2N, the redundant selection signal RS00, and as the common input signals, a redundant non-selection signal ERB0, a subword decode signal X0n, the selection signal of the plate n, the selection signal PSn+1 of the plate n+1, and the subword decode signal X0T, and produces subword selection signals SWE00n and SWE10n.

The subword selection circuit 302' is provided with the subword decode signal X1T2N, the redundant selection signal RS01 and the common input signal, and produces the subword selection signals SWE1n and SWE11n.

The subword selection circuit 303' is provided with the subword decode signal X1N2T, the redundant selection signal RS02 and the common input signal, and produces subword selection signals SWE02n and SWE12n.

The subword selection circuit 304' is provided with the subword decode signal X1T2T, the redundant selection signal RS03 and the common input signal, and produces subword selection signals SWE03n and SWE13n.

Further, the subword selection circuit block includes a subword selection circuit 331', a subword selection circuit 332', a subword selection circuit 333', and a subword selection circuit 334'.

In this event, the subword selection circuit 331' is provided with the subword decode signal X1N2N, the redundant selection signal RS30, and the common input signals, and produces subword selection signals SWE30n and SWE40n.

The subword selection circuit 332' is provided with the subword decode signal X1T2N, the redundant selection signal RS31 and the common input signal, and produces subword selection signals SWE31n and SWE41n.

The subword selection circuit 333' is provided with the subword decode signal X1N2T, the redundant selection signal RS32 and the common input signal, and produces subword selection signals SWE32n and SWE42n.

The subword selection circuit 334' is provided with the subword decode signal X1T2T, the redundant selection signal RS33 and the common input signal, and produces subword selection signals SWE33n and SWE43n.

Moreover, the subword selection circuit block further comprises the subword selection circuits 321~324, each having the same structure as the circuit illustrated in FIG. 17 and explained in the first embodiment.

In this case, the above-described subword selection circuits 301'~304' and 331'~334' are composed of the subword selection circuits illustrated in FIG. 21.

The subword selection circuit blocks 124 and 224 according to the second embodiment are different from the first embodiment in that the subword selection signals 118 and 218 are newly generated and is provided with to the subword drivers 121e and 221e using the block illustrated in FIG. 20.

With such a structure, it is possible to commonly use the redundant selection signals RS00~RS33 and the redundant non-selection signals REB~REB3.

In consequence, although the number of the redundant selection signals RS00~RS33, which are provided with to the subword selection circuit block 124, is equal to 16 in the first embodiment, the number is equal to 12 in the second embodiment.

Further, although the number of the redundant non-selection signals REB0~3 is equal to 4 in the first embodiment, the number thereof can be reduced to 3 in the second embodiment. As a result, the layout area can be further reduced.

Although description has been made about one unit of the redundant circuit structured by one redundant main word line in the second embodiment, this invention is not restricted the embodiment, and is readily applicable for two units or more of the redundant circuits having the two or more of redundant main word lines.

More specifically, there is provided a plurality of redundant main word drivers 125 and 225, and multiple units of the redundant circuits corresponding to the redundant main word drivers 125 and 225.

With this structure, the redundant main word driver 125 of the plate n is commonly provided with the redundant main word active signal PRX and the selection signal PSn of the plate n.

The redundant main word driver 225 of the plate n+1 is commonly provided with the redundant main word active signal PXR and the selection signal PSn+1 of the plate n+1. The subword selection signals (bundles 114~118 of lines and bundles 214~218 of lines) are commonly provided with to the corresponding redundant circuits, respectively. In this case, the defective chip-relieving rate due to the replacement can be enhanced.

Although description has been about 128 M synchronous DRAM as an example in the above-discussed embodiment, this invention may be applicable for DRAM having smaller capacity such as 64M, and may be applicable for the rambus DRAM which will be widely used in the future.

Figure 22:
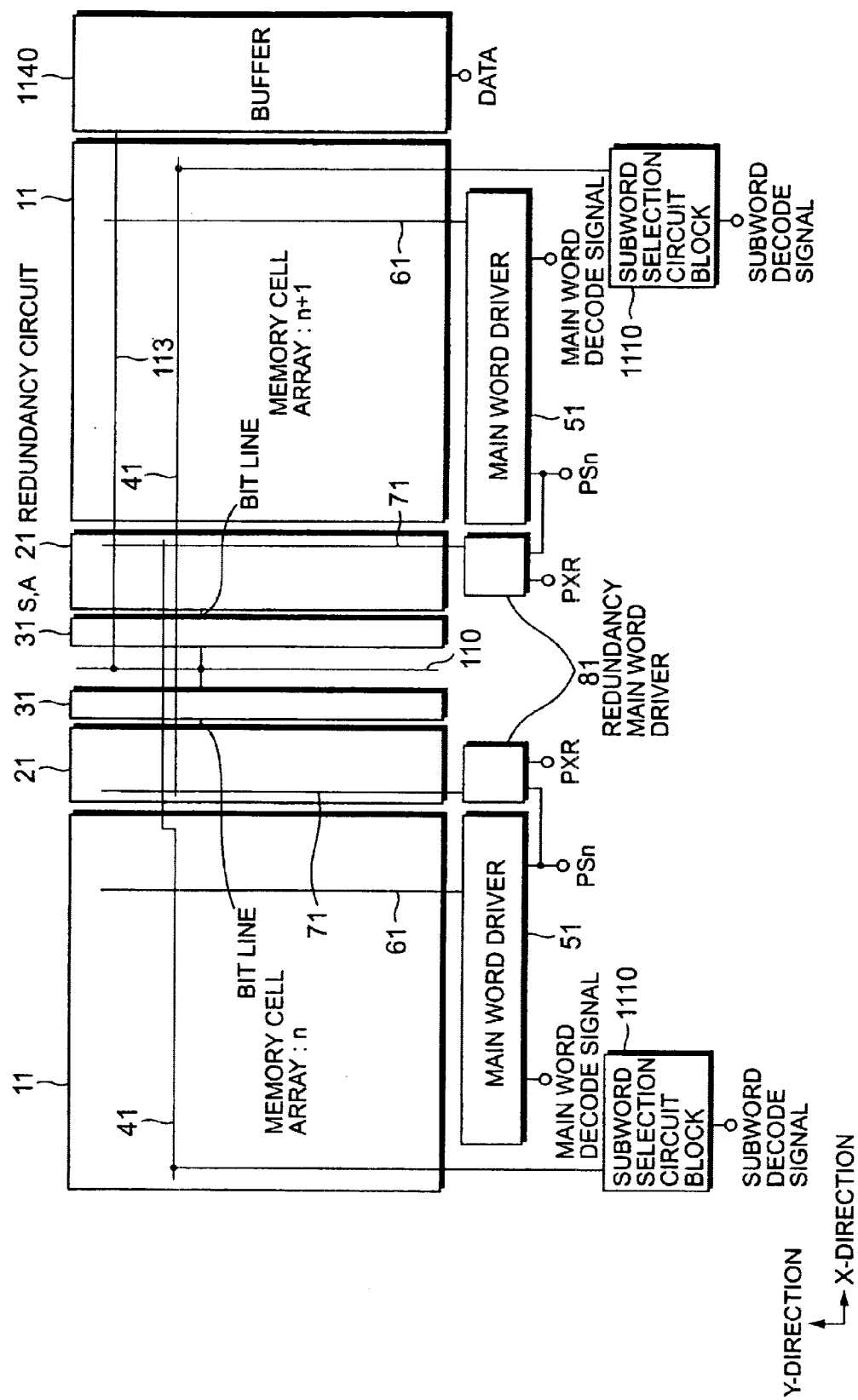
FIG. 22 is a block layout diagram according to a first embodiment.

Referring to FIG. 22, a first subword selection signal line 41 and a second subword selection signal line 41 are extended so as to cross in parallel direction along the redundant memory arrays of the respective plates, and are wired with the other redundant subword driver.

Herein, the first subword selection signal line 41 is connected to the subword selection circuit 124 of the plate n while the second subword selection signal line 42 is connected to the subword selection circuit 224 of the plate n+1.

As mentioned above, the subword selection circuits of the adjacent plates n, n+1 are commonly used between the respective plates. Consequently, 16 of the redundant subword selection signals specific to the existing redundant wired inside the memory cell array for one plate, and 16 of the redundant subword selection circuits specific to the existing subword selection circuit can be eliminated entirely according to this embodiment.

While this invention has thus far been disclosed in conjunction with several embodiments thereof, it will be readily possible for those skilled in the art to put this invention into practice in various other manners.

What is claimed is:

1. A semiconductor memory device comprising:
a plurality of banks which are arranged on a semiconductor substrate;
a plurality of plates;
a plurality of memory array groups which are arranged on the plates;
redundant memory cell array groups which replace a memory cell array including a defective memory cell and which are arranged at every plate; and
subword selection circuits which switch subword selection lines at every plate;
wherein each of the subword selection circuits has a selection unit which selects a subword selection line on the plate belonging thereto and a redundant subword selection line of the redundant memory cell array arranged on an adjacent plate; and
wherein the subword selection line is selected by the use of a subword driver, and predetermined redundant subword lines of the memory cell array and the redundant memory cell array are selected after an arbitrary main word line is selected by a row decoder during selecting a word line.

2. A semiconductor memory device comprising:
a plurality of plates which are arranged on a semiconductor substrate at every bank, each of the plates including:
memory cell array groups,
subword driver groups which select word lines of the memory cell array groups,
subword driver selection units which select one among the subword driver groups,
redundant memory cell array groups which replace a memory cell array group including a defective memory cell, and
redundant subword driver groups which select word lines of the redundant memory cell array groups; and
a redundant subword selection unit which selects one among the redundant subword driver groups;
wherein the redundant subword selection unit commonly uses the subword drive selection units between the adjacent plates, and is given a subword selection signal generated by the subword selection unit of one plate as a redundant subword selection signal of an adjacent plate in order to control selection of the word lines.

3. A semiconductor memory device comprising:
first and second plates which are arranged on a semiconductor substrate at every bank, each of the plates including:
memory cell array groups,
subword driver groups which select word lines of the memory cell array groups,
subword driver selection units which select one among the subword driver groups,
redundant memory cell array groups which replace a memory cell array group including a defective memory cell,
redundant subword driver groups which select word lines of the redundant memory cell array groups, and
a redundant subword selection unit which selects one among the redundant subword driver groups,
wherein both the subword driver selection unit and the redundant subword selection unit are commonly used by only the subword selection unit;
wherein the subword selection unit commonly used between the plates is commonly used between the first and second plates; and
wherein the common use between the first and second plates is carried out by the subword selection unit which commonly uses the redundant subword selection lines of the first and second plates in one of the plates for the other.

4. A semiconductor memory device as claimed in any one of claims 1 through claim 3, further comprising:
a plurality of redundant main word lines and a plurality of rows of the redundant memory cell array groups which are provided for each plate;
wherein said subword selection unit selects a plurality of the redundant subword selection lines of the redundant memory cell array.

5. A semiconductor memory device comprising:
a plurality of banks which are arranged on a semiconductor substrate;
a plurality of plates;
a plurality of memory array groups which are arranged on the plates;
redundant memory cell array groups which replace a memory cell array including a defective memory cell and which are arranged at every plate; and
subword selection circuits which switch subword selection lines at every plate;
wherein each of the subword selection circuits has a selection unit which selects a subword selection line on the plate belonging thereto and a redundant subword selection line of the redundant memory cell array arranged on an adjacent plate; and
wherein the subword selection line is selected by the use of a subword driver, and predetermined redundant subword lines of the memory cell array and the redundant memory cell array are selected after an arbitrary main word line is selected by a row decoder during selecting a word line, wherein:
the selection unit is provided with a logical add between at least a selection signal of a first plate and a selection signal of a second plate as a selection condition signal, a signal connection is carried out between adjacent plates,
one plate connects the selection signal of the first plate to a selection signal terminal of the first plate while the other plate connects to the selection signal terminal of the other plate the other plate connects the selection signal of the second plate to the selection signal terminal of the second plate while the first plate connects to the selection signal terminal of the first plate.

6. A semiconductor memory device as claimed in claim 5, wherein the first plate has the same circuit structure as the second plate; and wherein the selection signal of the first plate given to the first plate is put into an active state, and the selection signal of the second plate is put into a non-active state when replacing the redundant memory cell.

7. A semiconductor memory device as claimed in claim 6, wherein the selection unit comprises a first CMOS inverter provided with a subword decode signal; and whether a first serial connection body in which a first N-channel MOS transistor provided with the selection signal of the first plate, a second N-channel MOS transistor provided with the redundant non-selection signal, and a third N-channel MOS transistor provided with the subword decode signal are connected in series between a source of an N-channel MOS transistor of the inverter and a ground potential;

wherein an output of the first CMOS inverter is pulled up by a first P-channel MOS transistor and is supplied to a second CMOS inverter so as to produce an output as a first subword line selection signal;

wherein the output is provided to a gate of the first P-channel MOS transistor; and wherein a second serial connection body in which a fourth N-channel MOS transistor given with the selection signal of the second plate and a fifth N-channel MOS transistor given with the redundant selection signal are connected in parallel to the first serial connection body.

8. A semiconductor memory device as claimed in claim 7, wherein a first subword selection signal supplied to a first row of the subword driver of the first plate and a first row of the redundant subword driver of the second plate, and a second subword selection signal supplied to a first row of the subword driver of the second plate and a first row of the redundant subword driver of the first plate are on the same signal line as a subword selection signal of a first row of a subword driver.

9. A semiconductor memory device as claimed in claim 7, wherein the subword selection signal from subword drivers of a first row to an n-th row of each plate is on a signal line different from each other corresponding to the respective subword drivers.

10. A semiconductor memory device as claimed in claim 7, wherein the subword selection signal due to a combination of 2 bits of a first lower address signal serving as the subword decode signal is switched by commonly inputting the selection signal of the first plate, the selection signal of the second plate, the redundant selection signal, the redundant non-selection signal, and second and third subword decode signals to each subword selection circuit; and wherein two ways of subword selection signals for performing word selection corresponding to an inversion bit line among bit line pairs and word selection corresponding to a normal rotation bit line from one subword selection circuit are generated in order to reduce the number of output lines of a subword selection control circuit.

11. A semiconductor memory device as claimed in claim 7, wherein the subword selection circuit has a plurality of the selection units, and is given a subword decode signal obtained by decoding on the basis of second and third address signals among first, second, and third lower address signals, a redundant selection signal for selecting a predetermined redundant subword line, and a common input signal consisting of a redundant non-selection signal for non-selecting the subword line, polarity conversion signal or a normal rotation signal of the first lower address signal, a first plate selection signal and a second plate selection signal; and wherein the subword selection circuit has a plurality of selection units as one group with a plurality of groups, each selection unit having signals specifying the subword line corresponding to a normal rotation line or inversion line among bit line pairs in accordance with the normal rotation bit or the inversion bit at every one output.

12. A semiconductor memory device as claimed in claim 7, wherein the selection unit comprises a third CMOS inverter provided with the polarity inversion signal of the subword decode signal between a source of the first CMOS inverter and the power supply potential;

wherein an output of the inverter is pulled up to the power supply potential via a second P-channel transistor, and is supplied to the third MOS inverter;

wherein an output of the third MOS inverter is produced as a second subword selection signal; and wherein the output is given a gate of the second P-channel transistor.

13. A semiconductor memory device as claimed in claim 12, wherein the subword selection circuit has a plurality of the selection units, and is given a subword decode signal obtained by decoding on the basis of second and third address signals among first, second, and third lower address signals, a redundant selection signal for selecting a predetermined redundant subword line, and a common input signal consisting of a redundant non-selection signal for non-selecting the subword line, polarity conversion signal or a normal rotation signal of the first lower address signal, a first plate selection signal and a second plate selection signal; and wherein the subword selection circuit has a plurality of selection units as one group with a plurality of groups, each selection unit having a signal specifying the subword line corresponding to a normal rotation line among bit line pairs and a signal specifying the subword line corresponding to the conversion bit line at every one output.

14. A semiconductor memory device comprising:

a first memory cell array group and a first redundant memory cell array group which are divided and arranged into a first plate;

a second memory cell array group and a second redundant memory cell array group which are divided and arranged to a second plate adjacent to the first plate;

first subword selection circuit corresponding to the first plate;

a second subword selection circuit corresponding to the second plate;

a first subword selection signal line which is connected to the first subword selection circuit; and a second subword selection signal line which is connected to the second subword selection circuit;

wherein the first and second subword selection signal lines cross a redundant memory cell array of each plate so as to extend in a parallel direction, and are wired to a subword driver on an adjacent plate.

15. A method of replacing a redundant circuit of a semiconductor memory device, comprising the steps of:

dividing a memory cell array into a plurality of memory blocks;

grouping the memory blocks into a plurality of plates;

arranging a redundant memory block for each plate;

arranging a subword driver or a redundant subword driver in accordance with the memory block and the redundant memory block in order to perform word selection;

selecting the block when the memory block includes a defective memory cell; and replacing the redundant memory block;

wherein the redundant subword of the plate including the defective cell is mutually selected by the use of a subword selection signal generated by a subword selection circuit of the adjacent plate, and whereby, the subword selection circuit is commonly used between the plates so as to replace the redundant memory block.

* * * * *